(12) United States Patent
Xi

(10) Patent No.: US 10,726,773 B2
(45) Date of Patent: Jul. 28, 2020

(54) PIXEL UNIT

(71) Applicant: Au Optronics Corporation, Hsinchu (TW)

(72) Inventor: Peng-Bo Xi, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 6 days.

(21) Appl. No.: 16/198,889

(22) Filed: Nov. 23, 2018

(65) Prior Publication Data

US 2020/0051490 A1 Feb. 13, 2020

(30) Foreign Application Priority Data

Aug. 13, 2018 (TW) .............................. 107128206 A

(51) Int. Cl.
*G09G 3/32* (2016.01)
*H01L 25/16* (2006.01)
(Continued)

(52) U.S. Cl.
CPC .............. *G09G 3/32* (2013.01); *G09G 3/2003* (2013.01); *G09G 3/3233* (2013.01); *G09G 2300/0426* (2013.01); *G09G 2300/0443* (2013.01); *G09G 2300/0809* (2013.01); *G09G 2310/0264* (2013.01); *G09G 2320/0257* (2013.01);
(Continued)

(58) Field of Classification Search
CPC ........... G09G 2330/08; G09G 2330/02; G09G 2330/10; G09G 2330/00; G09G 2330/12; G09G 2320/046; G09G 2320/04; G09G 2320/043; G09G 2320/045; G09G 2320/048; G09G 2300/0413; G09G 2300/0426; H01L 2251/562; H01L 2251/568; G02F 1/136259;
(Continued)

(56) References Cited

U.S. PATENT DOCUMENTS 7,880,698 B2 2/2011 Park et al.
9,129,923 B1* 9/2015 Han .................... H01L 27/3248
(Continued)

FOREIGN PATENT DOCUMENTS

CN 1779766 5/2006
CN 1963609 5/2007
(Continued)

*Primary Examiner* — Nitin Patel
*Assistant Examiner* — Amen Woldesenbet Bogale
(74) *Attorney, Agent, or Firm* — JCIPRNET

(57) ABSTRACT

A pixel unit includes signal lines and two pixel groups respectively corresponding to and electrically connected to the signal lines. Each pixel group has three sub-pixels of different colors. Each sub-pixel of the same color has a primary driving unit, a sub-driving unit, and a current-driving device. In a first state, the primary driving unit of one of the sub-pixels of the same color is enabled to provide a driving potential to the current-driving device of the sub-pixel, and the primary driving unit of the other sub-pixel of the same color is enabled to provide the driving potential to the current-driving device of the other sub-pixel. In a second state, the primary driving unit of one of the sub-pixels of the same color and the sub-driving unit of the other sub-pixel of the same color are enabled to provide the driving potential to the current-driving device of the sub-pixel.

19 Claims, 19 Drawing Sheets

(51) Int. Cl.
*G09G 3/20* (2006.01)
*G09G 3/3233* (2016.01)

(52) U.S. Cl.
CPC ... *G09G 2320/045* (2013.01); *G09G 2330/08* (2013.01); *G09G 2330/10* (2013.01); *H01L 25/167* (2013.01)

(58) Field of Classification Search
CPC ........ G02F 2001/136263; G02F 2001/136268; G02F 2001/136272
See application file for complete search history.

(56) References Cited

U.S. PATENT DOCUMENTS

| | | | |
|---|---|---|---|
| 9,147,723 B1 * | 9/2015 | Lee | G09G 3/006 |
| 9,468,050 B1 | 10/2016 | Rotzoll et al. | |
| 9,542,885 B2 | 1/2017 | Wang et al. | |
| 9,728,119 B2 | 8/2017 | Snijder | |
| 9,852,683 B2 | 12/2017 | Liu | |
| 9,972,549 B2 | 5/2018 | Wu et al. | |
| 2006/0132668 A1 | 6/2006 | Park et al. | |
| 2007/0279424 A1 | 12/2007 | Keeney et al. | |
| 2012/0075271 A1 | 3/2012 | Snijder | |
| 2014/0319486 A1 * | 10/2014 | Hong | G09G 3/32 257/40 |
| 2015/0103103 A1 * | 4/2015 | Kim | G09G 3/3233 345/690 |
| 2015/0108437 A1 * | 4/2015 | Cho | H01L 27/3248 257/40 |
| 2015/0161931 A1 * | 6/2015 | Lee | G09G 3/3266 345/77 |
| 2015/0161943 A1 * | 6/2015 | Shim | G09G 3/3225 345/76 |
| 2015/0339975 A1 | 11/2015 | Liu | |
| 2016/0005383 A1 * | 1/2016 | Lee | G09G 3/3291 345/690 |
| 2016/0275858 A1 | 9/2016 | Wang et al. | |
| 2018/0090069 A1 * | 3/2018 | Hwang | G09G 3/3233 |
| 2018/0108679 A1 * | 4/2018 | Wu | H01L 22/20 |
| 2019/0371235 A1 * | 12/2019 | Lee | H01L 27/3276 |

FOREIGN PATENT DOCUMENTS

| | | |
|---|---|---|
| CN | 104036700 | 9/2014 |
| CN | 104167181 | 11/2014 |
| CN | 102449679 | 1/2015 |
| CN | 106653802 | 5/2017 |
| CN | 106971688 | 7/2017 |
| CN | 108447441 | 8/2018 |

* cited by examiner

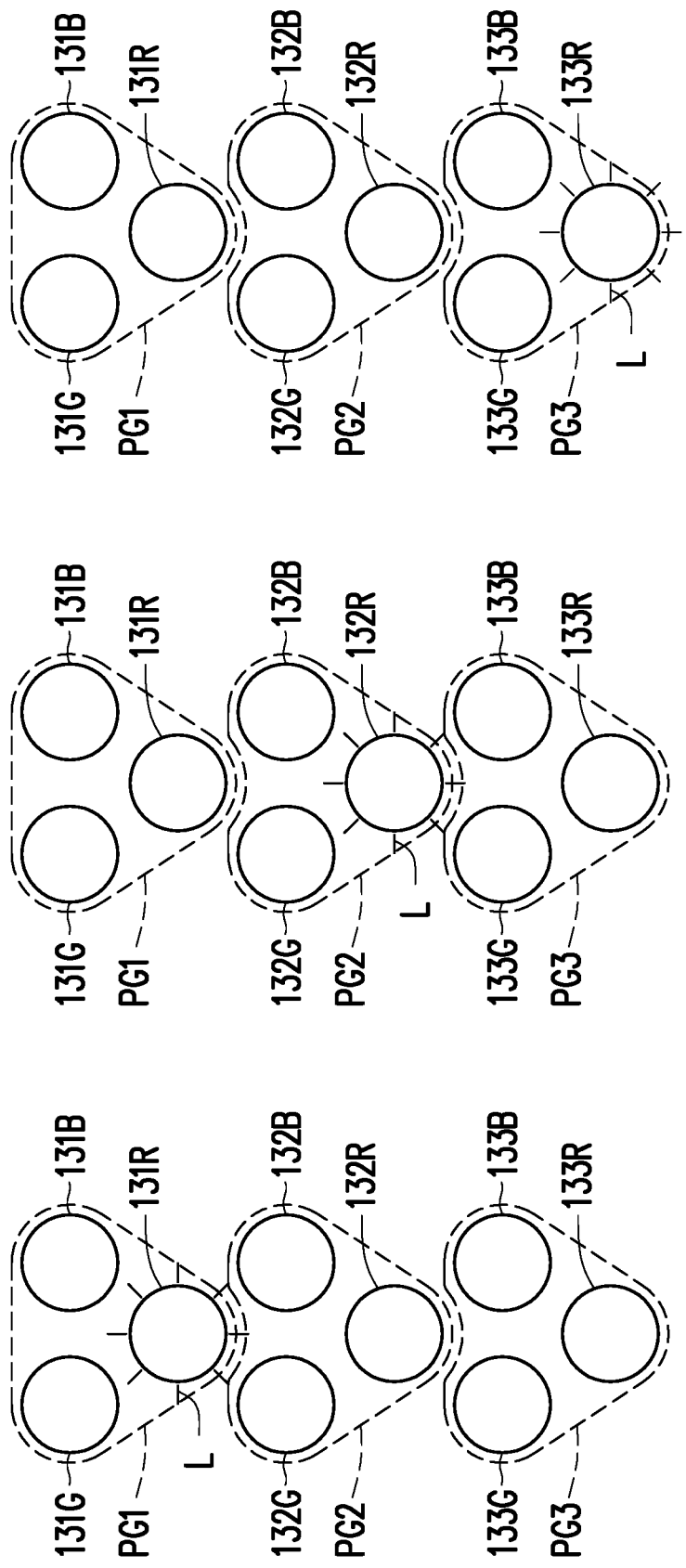

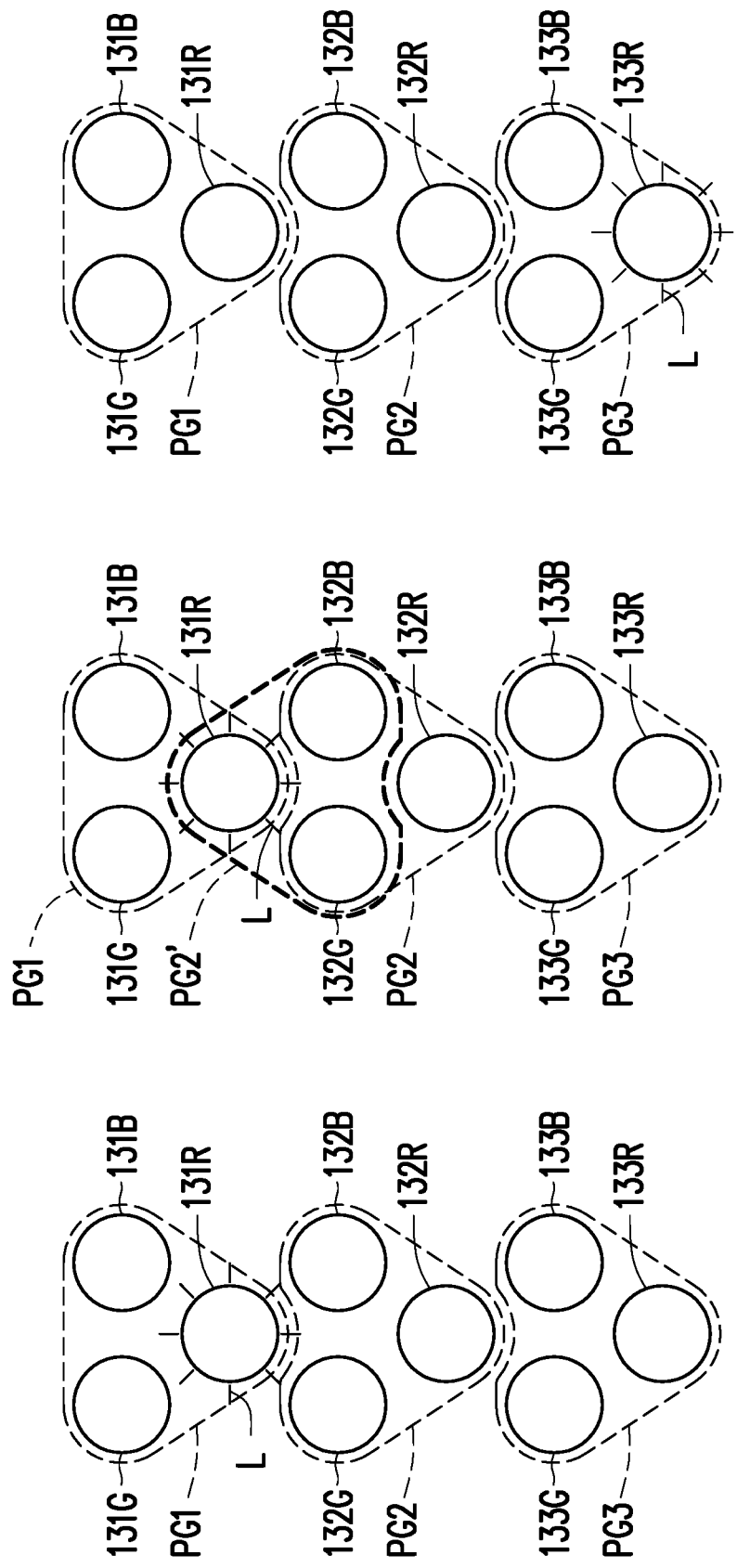

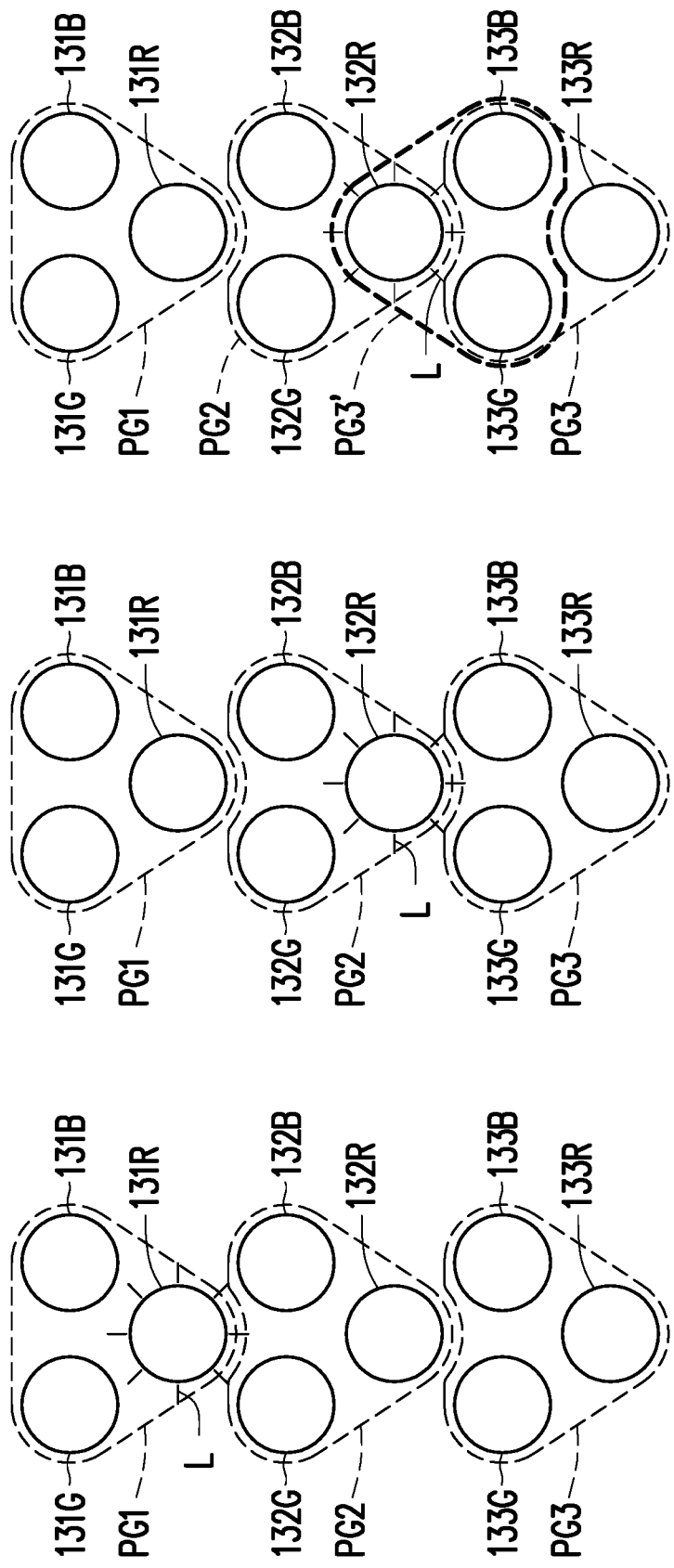

PIXEL UNIT

CROSS REFERENCE TO RELATED APPLICATION

This application claims the priority benefit of Taiwan application serial no. 107128206, filed on Aug. 13, 2018. The entirety of the above-mentioned patent application is hereby incorporated by reference herein and made a part of specification.

BACKGROUND

Technical Field

The disclosure relates to a pixel unit; more particularly, the disclosure relates to a pixel unit of a display panel.

Description of Related Art

Thanks to numerous advantages of long life span, miniature size, high vibration and shock resistance, low heat generation, economical power consumption and so on, light emitting diodes (LEDs) have been widely applied to indicating lights or light sources employed in a variety of household electric appliances and instruments. In recent years, the LEDs have been developed to have multiple colors and high brightness; therefore, the application scope of the LEDs has been expanded to large outdoor display boards, traffic signal lights, and the like. In the future, the LEDs may even become the main illumination light source with both power-saving and environment-protecting functions.

However, if the LEDs are damaged, malfunctioned, or have low performance, the display quality is often lowered. Alternatively, when the LEDs are operated in a normal manner but for a long time (e.g., the home button on a mobile phone screen or other regions that remain lit), issues of damages to the LEDs or poor display (e.g., image retention or ghosting) are likely to occur. Hence, prompt solutions to improve the display quality of the pixel unit are needed.

SUMMARY

In an exemplary embodiment of the disclosure, a pixel unit including a plurality of signal lines and two pixel groups is provided. The pixel groups respectively correspond to and are electrically connected to the signal lines. Each of the pixel groups has three sub-pixels of different colors. Two of the sub-pixels of a same color are respectively located in different pixel groups of the pixel groups, and the sub-pixels of the same color both have a primary driving unit, a sub-driving unit, and a current-driving device. In a first state, the primary driving unit of one of the sub-pixels of the same color is enabled to provide a driving potential to the current-driving device of the one of the sub-pixels of the same color, and the primary driving unit of the other one of the sub-pixels of the same color is enabled to provide the driving potential to the current-driving device of the other one of the sub-pixels of the same color without enabling the sub-driving units of the sub-pixels of the same color. In a second state, the primary driving unit of one of the sub-pixels of the same color and the sub-driving unit of the other one of the sub-pixels of the same color are enabled to provide the driving potential to the current-driving device of the one of the sub-pixels of the same color without enabling the sub-driving unit of the one of the sub-pixels of the same color and the primary driving unit of the other one of the sub-pixels of the same color.

In an exemplary embodiment, a pixel unit including a plurality of signal lines, at least two power lines, and two pixel groups is provided. The two pixel groups respectively correspond to and are electrically connected to the signal lines. Each of the pixel groups has three sub-pixels of different colors. Two of the sub-pixels of a same color are respectively located in different pixel groups of the pixel groups, and the sub-pixels of the same color both have a primary driving unit, a sub-driving unit, and a current-driving device. The current-driving devices of the sub-pixels of the same color respectively correspond to and are electrically connected to the power lines. In a first state, the primary driving unit of one of the sub-pixels of the same color is electrically connected to the current-driving device of the one of the sub-pixels of the same color through a first bridge electrode, the primary driving unit of the other one of the sub-pixels of the same color is electrically connected to the current-driving device of the other one of the sub-pixels of the same color through a second bridge electrode, an open circuit is formed between the sub-driving unit of one of the sub-pixels of the same color and one of the power line, and an open circuit is formed between the sub-driving unit of the other one of the sub-pixels of the same color and the primary driving unit of the one of the sub-pixels as well as the first bridge electrode. In a second state, the primary driving unit of one of the sub-pixels of the same color is electrically connected to the current-driving device of the one of the sub-pixels of the same color through the first bridge electrode, the sub-driving unit of the other one of the sub-pixels of the same color is electrically connected to the current-driving device of the one of the sub-pixels of the same color through a third bridge electrode, an open circuit is formed between the sub-driving unit of one of the sub-pixels of the same color and one of the power lines, and an open circuit is formed between the primary driving unit as well as the current-driving device of the other one of the sub-pixels of the same color and the primary driving unit of the one of the sub-pixels.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

FIG. 3B to FIG. 3D are schematic top views illustrating a display manner of some of the pixel groups of the pixel unit according to the first embodiment of the disclosure.

FIG. 4B to FIG. 4D are schematic top views illustrating another display manner of some of the pixel groups of the pixel unit according to the first embodiment of the disclosure.

FIG. 5B to FIG. 5D are schematic top views illustrating still another display manner of some of the pixel groups of the pixel unit according to the first embodiment of the disclosure.

DESCRIPTION OF THE EMBODIMENTS

Figure 1A:
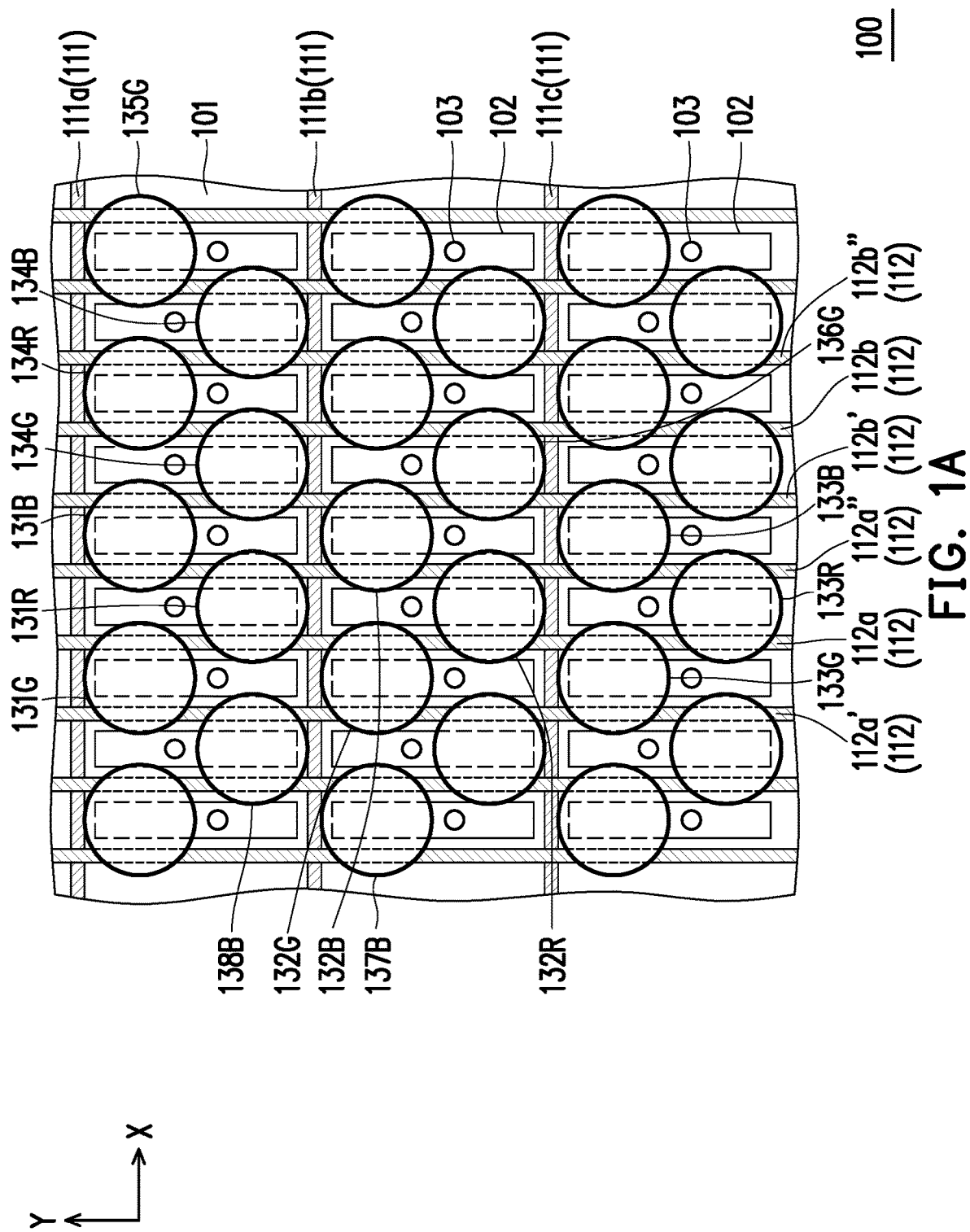
FIG. 1A to FIG. 1D are schematic top views of a portion of a pixel unit according to an embodiment of the disclosure.
Figure 1B:
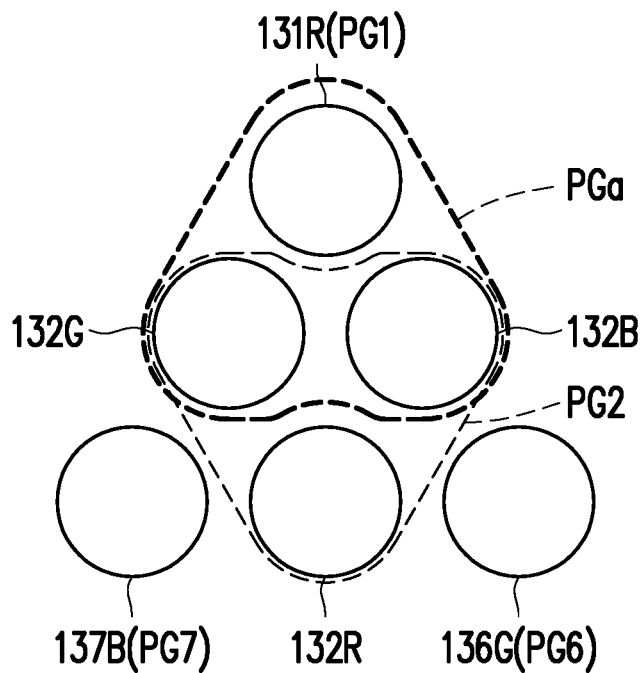
Figure 1C:
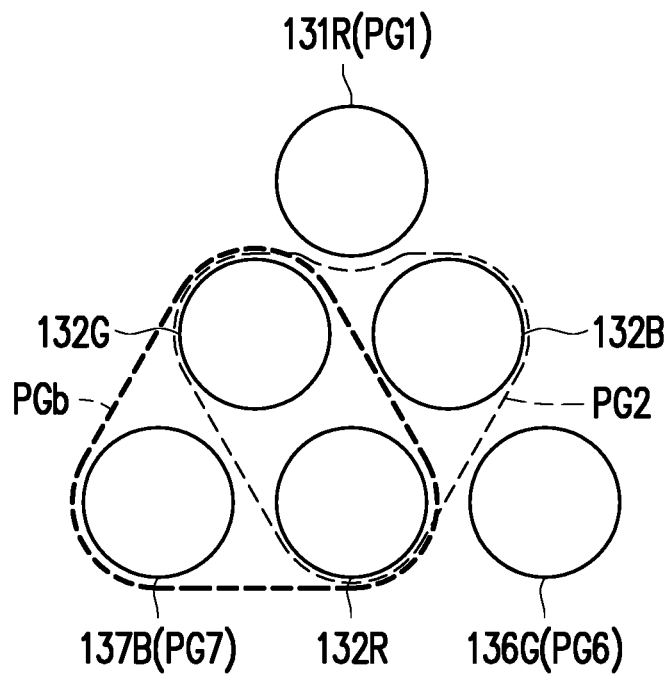
Figure 1D:
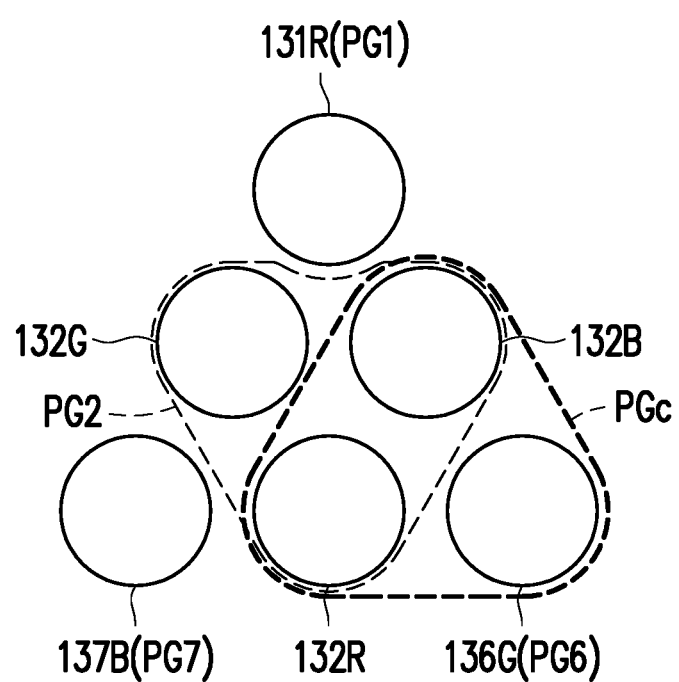

Throughout the specification, the same reference numerals in the accompanying drawings denote the same devices. In the accompanying drawings, thicknesses of layers, films, panels, regions and so on are exaggerated for clarity. It should be understood that when an element such as a layer, film, region or substrate is referred to as being "on" or "connected to" another device, it can be directly on or connected to the other device, or intervening devices may also be present. In contrast, when a device is referred to as being "directly on" or "directly connected to" another device, there are no intervening devices present. As used herein, the term "connected" may refer to physically connected and/or electrically connected. Furthermore, the "electrical connection" or "coupling" of the two devices may indicate that there are other devices between the two devices.

It should be understood that the terms "first," "second," "third," "fourth," "fifth," and "sixth" or "one," "another," and "still another" may be used to describe different elements in the disclosure, but these elements should not be limited by these terms. These terms are only used to distinguish the elements from one another. For instance, a first element may be referred to as a second element; similarly, a second element may be referred to as a first element without departing from the scope of the inventive concept. An element may also be referred to as another element; similarly, another element may be referred to as still another element without departing from the scope of the inventive concept.

The term "about," "approximately," "similar," or "substantially" as used herein is inclusive of the stated value and means within an acceptable range of deviation for the particular value as determined by people having ordinary skill in the art, considering the measurement in question and the error associated with measurement of the particular quantity (i.e., the limitations of the measurement system) or the limitations of the manufacturing system. For instance, "about" may mean within one or more standard deviations, or within, for example, ±30%, ±20%, ±10%, or ±5% of the stated value. Moreover, a relatively acceptable range of deviation or standard deviation may be chosen for the term "about," "approximately," or "substantially" as used herein based on optical properties, etching properties or other properties, instead of applying one standard deviation across all the properties.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

The IEEE, IEC, GB/T, JIS, and/or CNS standards are used as much as possible in the schematic views illustrating circuit connections. Certainly, there are several standards for circuitry symbols, which may vary from region to region, and some are slightly different, but those having ordinary skill in the pertinent art should understand the meaning.

The light L provided in the description and/or the drawings may have different colors depending on the type of the current driving devices or may have different brightnesses depending on the magnitude of the current flowing through the corresponding current driving devices. Namely, no limitation to the color or brightness of the light L is imposed in the description and/or the drawings.

FIG. 1A to FIG. 1D are schematic top views illustrating a portion of a pixel unit according to an embodiment of the disclosure. FIG. 2A is a schematic view illustrating a circuit connection of one sub-pixel of a pixel unit in a first state according to an embodiment of the disclosure. FIG. 2B is a schematic view illustrating a circuit connection of one sub-pixel of a pixel unit in a second state according to an embodiment of the disclosure.

Figure 2A:
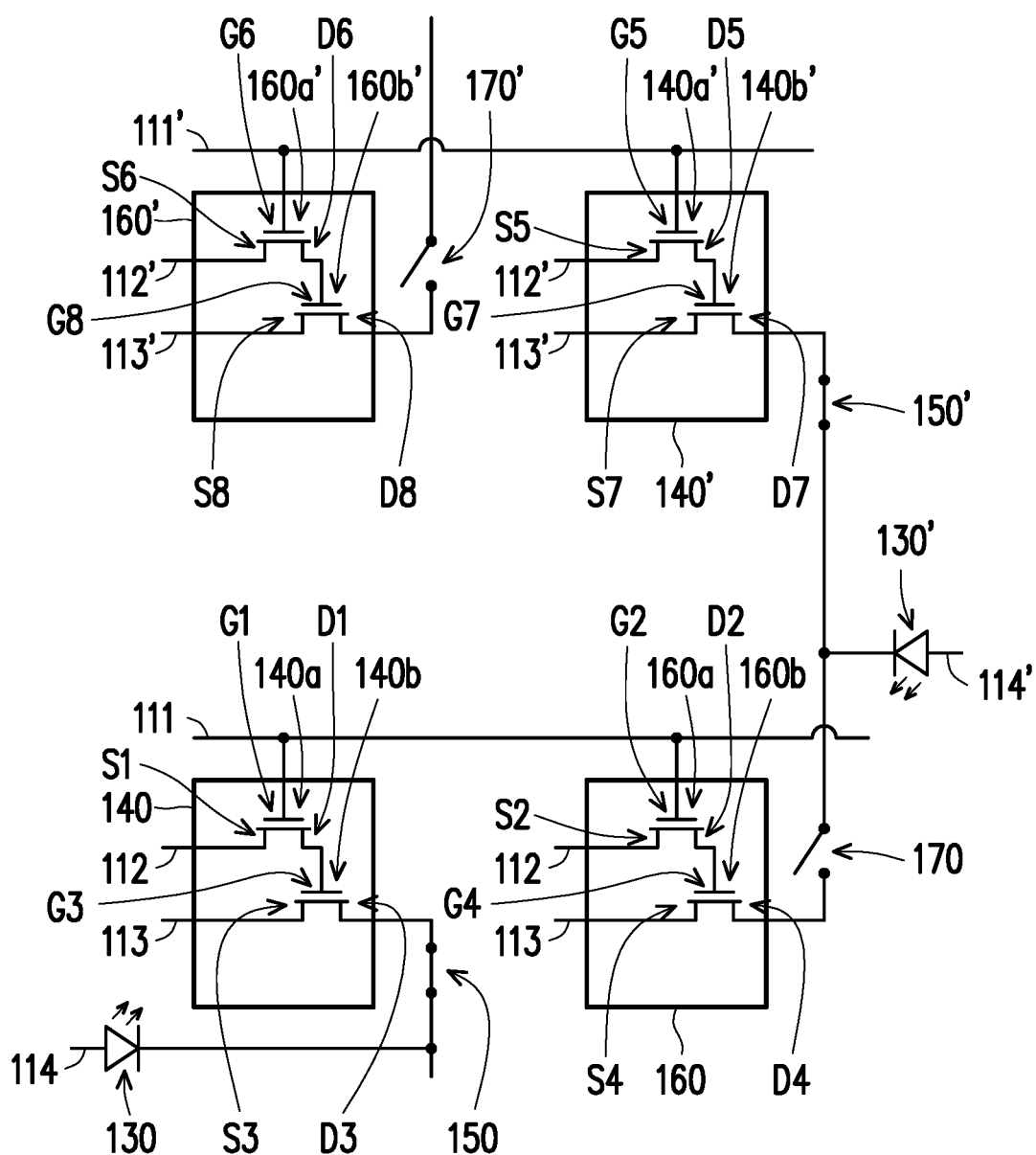
FIG. 2A is a schematic view illustrating a circuit connection of two sub-pixels of a pixel unit in a first state according to an embodiment of the disclosure.
Figure 2B:
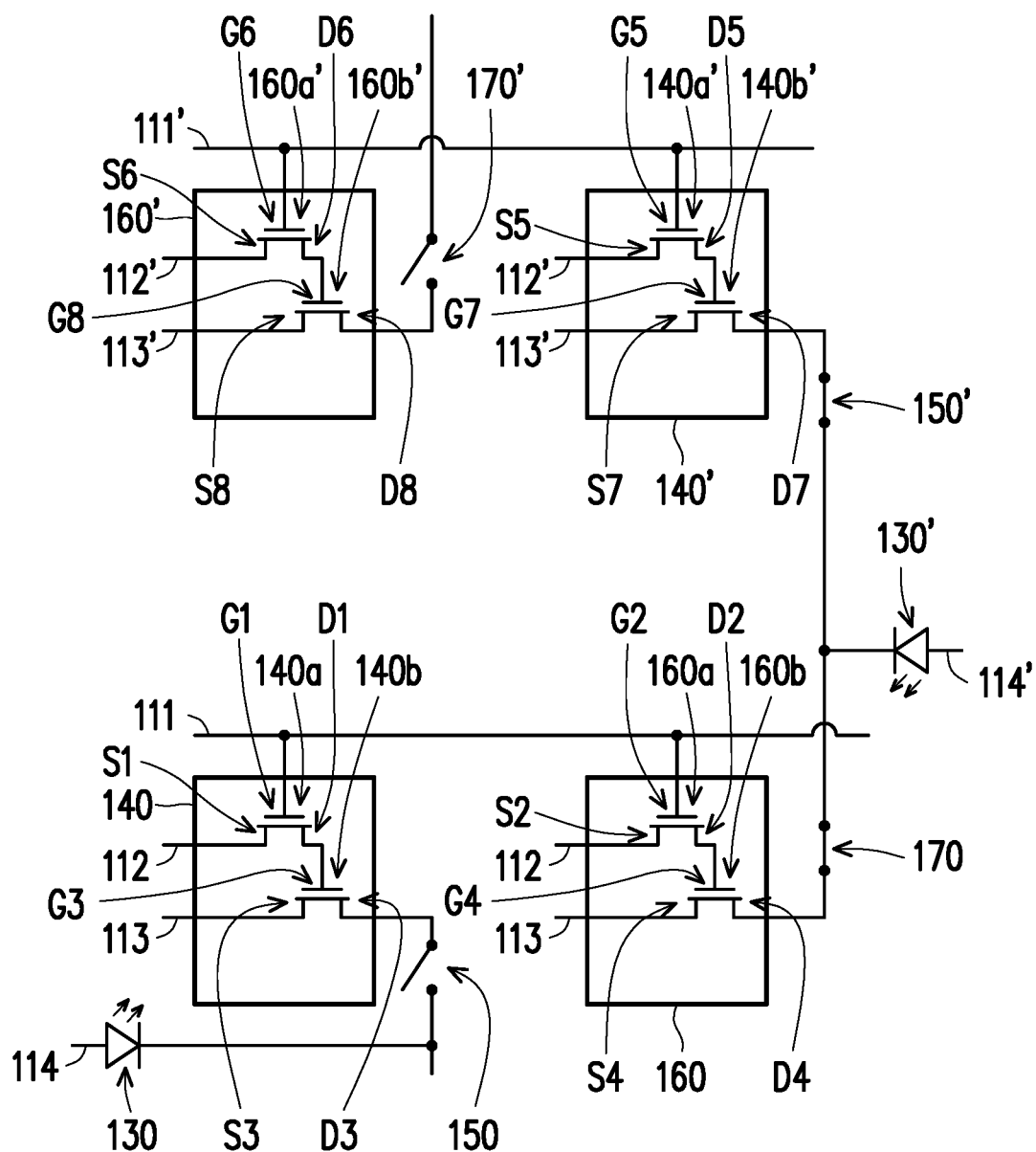
FIG. 2B is a schematic view illustrating a circuit connection of two sub-pixels of a pixel unit in a second state according to an embodiment of the disclosure.

Referring to FIG. 1A, a pixel unit 100 provided in the present embodiment includes a plurality of signal lines 111 and 112 and at least two pixel groups (e.g., two of the adjacent pixel groups PG1 to PG7 as shown in the drawings and provided in the following embodiments). The signal lines may include a plurality of first signal lines 111 and a plurality of second signal lines 112. Structurally, the first signal lines 111 and the second signal lines 112 may be disposed on a substrate 101, the first signal lines 111 substantially extend along a first direction X, the second signal lines 112 substantially extend along a second direction Y, and the first signal lines 111 and the second signal lines 112 may be interlaced. The first signal lines 111 and the second signal lines 112 may constitute a plurality of driving circuit regions 102 arranged in an array on the substrate 101. In this embodiment, the first signal lines 111 are scan lines, and the second signal lines 112 are data lines, for instance, which should however not be construed as limitations in the disclosure. In other embodiments, the first signal lines 111 are the data lines, and the second signal lines 112 are the scan lines, for instance.

As shown in FIG. 2A or FIG. 2B, the sub-pixels 120 and 120' have corresponding primary driving units 140, 140', primary bridge electrodes 150, 150', sub-driving units 160, 160', sub-bridge electrodes 170, 170', and current-driving devices 130, 130'. The primary bridge electrodes 150, 150' of the sub-pixels 120, 120' are disposed corresponding to the primary driving units 140, 140' of the sub-pixels 120, 120', and the sub-bridge electrodes 170, 170' of the sub-pixels 120, 120' are disposed corresponding to the sub-driving units 160, 160' of the sub-pixels 120, 120'. For instance, as shown in FIG. 2A or FIG. 2B, the sub-pixel 120 has the corresponding primary driving unit 140, the corresponding primary bridge electrode 150, the corresponding sub-driving unit 160, the corresponding sub-bridge electrode 170, and the corresponding current-driving device 130. The primary bridge electrode 150 of the sub-pixel 120 is disposed corresponding to the primary driving unit 140 of the sub-pixel 120, and the sub-bridge electrode 170 of the sub-pixel 120 is disposed corresponding to the sub-driving unit 160 of the sub-pixel 120. The sub-pixel 120' has the corresponding primary driving unit 140', the corresponding primary bridge electrode 150', the corresponding sub-driving unit 160', the corresponding sub-bridge electrode 170', and the corresponding current-driving device 130'. The primary bridge electrode 150' of the sub-pixel 120' is disposed corresponding to the primary driving unit 140' of the sub-pixel 120', and the sub-bridge electrode 170' of the sub-pixel 120' is disposed corresponding to the sub-driving unit 160' of the sub-pixel 120'.

Structurally, the primary driving units 140, 140' and the sub-driving units 160, 160' of the sub-pixels 120, 120' are disposed in the corresponding driving circuit region 102 (shown in FIG. 1A). In each sub-pixel 120 or 120', one of the primary driving unit 140 or 140' and the sub-driving unit 160 or 160' may be electrically connected to the current-driving device 130 or 130' of the sub-pixel 120 or 120' through a conductive via 103 (shown in FIG. 1A).

The current-driving device 130 may include first current-driving devices 131R, 132R, 133R, 134R, second current-driving devices 131G, 132G, 133G, 134G, 135G, 136G, and third current-driving devices 131B, 132B, 133B, 134B, 137B. The first current-driving devices 131R, 132R, 133R, 134R, the second current-driving devices 131G, 132G, 133G, 134G, 135G, 136G, and the third current-driving devices 131B, 132B, 133B, 134B, 137B are micro light emitting devices of different colors of light, for instance. Hence, the sub-pixels 120 at least having three different colors (e.g., the three sub-pixels 120 respectively including the first current-driving device 131R, the second current-driving device 131G, and the third current-driving device 131B, and the rest may be deduced in the similar manner) may constitute a pixel group (e.g., any of pixel groups PG1 to PG4 depicted in the drawings and provided in the following embodiments or any other similar pixel group). Generally, if the driving current is less than a saturation current, the luminance of the current-driving device 130 is increased together with an increase in the driving current, which should however not be construed as a limitation in the disclosure.

In the present embodiment, the first current-driving devices 131R, 132R, 133R, 134R are red, for instance, the second current-driving devices 131G, 132G, 133G, 134G, 135G, 136G are green, for instance, and the third current-driving devices 131B, 132B, 133B, 134B, 137B are blue, for instance, which should however not be construed as limitations in the disclosure.

On the substrate 101, the first current-driving devices 131R, 132R, 133R, 134R, the second current-driving devices 131G, 132G, 133G, 134G, 135G, 136G, and the third current-driving devices 131B, 132B, 133B, 134B, 137B may be arranged in a delta manner or in a delta-like manner. Thereby, if one of the current-driving devices 130 in a pixel group is damaged, is malfunctioned, has low performance, is operated in a normal manner but for a long time, or is in a similar standby state, the current-driving device of the identical or substantially the same color in an adjacent pixel group may be applied to form a spare pixel group, so as to reduce the chromatic aberration caused by the damage to, the malfunction of, or the low performance of the current-driving device 130, or reduce the possibility of damaging the current-driving device 130 due to the normal but long-term use of the current-driving device 130.

For instance, referring to FIG. 1A to FIG. 1D, As exemplarily shown in FIG. 1A to FIG. 1D, the first current-driving device 132R, the second current-driving device 132G, and the third current-driving device 132B in the pixel group PG2 may be adjacent to one another and arranged in a delta or delta-like manner. The second current-driving device 132G and the third current-driving device 132B in the pixel group PG2 and the first current-driving device 131R in the adjacent pixel group PG1 may be adjacent and arranged in a delta or delta-like manner, so as to constitute a spare pixel group PGa shown in FIG. 1B. The first current-driving device 132R and the second current-driving device 132G in the pixel group PG2 and the third current-driving device 137B in the adjacent pixel group PG7 may be adjacent and arranged in a delta or delta-like manner, so as to constitute another spare pixel group PGb shown in FIG. 1C. The first current-driving device 132R and the third current-driving device 132B in the pixel group PG2 and the second current-driving device 136G in the adjacent pixel group PG6 may be adjacent and arranged in a delta or delta-like manner, so as to constitute another spare pixel group PGc shown in FIG. 1D.

The circuit connection of the sub-pixel 120 is shown in FIG. 2A and FIG. 2B, for instance. Referring to FIG. 2A and FIG. 2B, the primary driving unit 140 may be constituted by a switch device 140a and a driving device 140b, and the sub-driving unit 160 may be constituted by another switch device 160a and another driving device 160b. In the present embodiment, the switch device 140a is a transistor having a source electrode S1, a drain electrode D1, and a gate electrode G1, the switch device 160a is a transistor having a source electrode S2, a drain electrode D2, and a gate electrode G2, the driving device 140b is a transistor having a source electrode S3, a drain electrode D3, and a gate electrode G3, and the driving device 160b is a transistor having a source electrode S4, a drain electrode D4, and a gate electrode G4, which should however not be construed as limitations in the disclosure.

For instance, in the primary driving unit 140, the gate electrode G1 of the switch device 140a is electrically connected to a corresponding first signal line 111, the source electrode S1 of the switch device 140a is electrically connected to a corresponding second signal line 112, the drain electrode D1 of the switch device 140a is electrically connected to the gate electrode G3 of the driving device 140b, and the source electrode S3 of the driving device 140b is electrically connected to the first power line 113. While the primary driving unit 140 is being operated, whether the driving device 140b is turn-on (such as closed circuit) or turn-off (such as open circuit) is controlled by the switch device 140*a* through signals transmitted through the first signal lines 111 and the second signal lines 112. When the driving device 140*b* is turn-on (such as closed circuit), the driving device 140*b* allows its source electrode S3 to transmit a driving potential provided by the first power line 113 to its drain electrode D3.

In the sub-driving unit 160, the gate electrode G2 of the switch device 160*a* is electrically connected to a corresponding first signal line 111, the source electrode S2 of the switch device 160*a* is electrically connected to a corresponding second signal line 112, the drain electrode D2 of the switch device 160*a* is electrically connected to the gate electrode G4 of the driving device 160*b*, and the source electrode S4 of the driving device 160*b* is electrically connected to the first power line 113. While the sub-driving unit 160 is being operated, whether the driving device 160*b* is turn-on (such as closed circuit) or turn-off (such as open circuit) is controlled by the switch device 160*a* through signals transmitted through the first signal lines 111 and the second signal lines 112. When the driving device 160*b* is turn-on (such as closed circuit), the driving device 160*b* allows its source electrode S4 to transmit the driving potential provided by the first power line 113 to its drain electrode D4.

The circuit connection of the sub-pixel 120' is shown in FIG. 2A and FIG. 2B, for instance. Referring to FIG. 2A and FIG. 2B, the primary driving unit 140' may be constituted by a switch device 140*a*' and a driving device 140*b*', and the sub-driving unit 160' may be constituted by another switch device 160*a*' and another driving device 160*b*'. In the present embodiment, the switch device 140*a*' is a transistor having a source electrode S5, a drain electrode D5, and a gate electrode G5, the switch device 160*a*' is a transistor having a source electrode S6, a drain electrode D6, and a gate electrode G6, the driving device 140*b*' is a transistor having a source electrode S7, a drain electrode D7, and a gate electrode G7, and the driving device 160*b*' is a transistor having a source electrode S8, a drain electrode D8, and a gate electrode G8, which should however not be construed as limitations in the disclosure.

For instance, in the primary driving unit 140', the gate electrode G5 of the switch device 140*a*' is electrically connected to a corresponding first signal line 111', the source electrode S5 of the switch device 140*a*' is electrically connected to a corresponding second signal line 112', the drain electrode D5 of the switch device 140*a*' is electrically connected to the gate electrode G7 of the driving device 140*b*', and the source electrode S7 of the driving device 140*b*' is electrically connected to the first power line 113'. While the primary driving unit 140' is being operated, whether the driving device 140*b*' is turn-on (such as closed circuit) or turn-off (such as open circuit) is controlled by the switch device 140*a*' through signals transmitted through the first signal lines 111' and the second signal lines 112'. When the driving device 140*b*' is turn-on (such as closed circuit), the driving device 140*b*' allows its source electrode S7 to transmit a driving potential provided by the first power line 113' to its drain electrode D7.

In the sub-driving unit 160', the gate electrode G6 of the switch device 160*a*' is electrically connected to a corresponding first signal line 111', the source electrode S6 of the switch device 160*a*' is electrically connected to a corresponding second signal line 112', the drain electrode D6 of the switch device 160*a*' is electrically connected to the gate electrode G8 of the driving device 160*b*', and the source electrode S8 of the driving device 160*b*' is electrically connected to the first power line 113'. While the sub-driving unit 160' is being operated, whether the driving device 160*b*' is turn-on (such as closed circuit) or turn-off (such as open circuit) is controlled by the switch device 160*a*' through signals transmitted through the first signal lines 111' and the second signal lines 112'. When the driving device 160*b*' is turn-on (such as closed circuit), the driving device 160*b*' allows its source electrode S8 to transmit the driving potential provided by the first power line 113' to its drain electrode D8.

FIG. 2A is a schematic view illustrating a circuit connection of two sub-pixels of a pixel unit in a first state according to an embodiment of the disclosure.

When the sub-pixel 120 is in a first state (or namely a normal state), the primary driving unit 140 of the sub-pixel 120 may be enabled to provide a driving potential to the current-driving device 130 of the sub-pixel 120 through the first power line 113. The sub-driving unit 160 of the sub-pixel 120 is not enabled.

When the sub-pixel 120' is in the first state (or namely the normal state), the primary driving unit 140' of the sub-pixel 120' may be enabled to provide a driving potential to the current-driving device 130' of the sub-pixel 120' through the first power line 113'. The sub-driving unit 160' of the sub-pixel 120' is not enabled.

For instance, a closed circuit may be formed between the primary driving unit 140 of the sub-pixel 120 and the current-driving device 130 of the sub-pixel 120 through the primary bridge electrode 150 of the sub-pixel 120, and an open circuit may be formed between the sub-driving unit 160 of the sub-pixel 120 and the current-driving device 130' of the sub-pixel 120' through the sub-bridge electrode 170 of the sub-pixel 120. As such, the primary driving unit 140 of the sub-pixel 120 may drive the current-driving device 130 of the sub-pixel 120 through the signals transmitted through the first signal lines 111 and the second signal lines 112 but may not drive the current-driving device 130' of the sub-pixel 120'.

Besides, a closed circuit may be formed between the primary driving unit 140' of the sub-pixel 120' and the current-driving device 130' of the sub-pixel 120' through the primary bridge electrode 150' of the sub-pixel 120', and an open circuit may be formed between the sub-driving unit 160' of the sub-pixel 120' and another current-driving device (not shown) of another sub-pixel (not shown) through the sub-bridge electrode 170' of the sub-pixel 120'. As such, the primary driving unit 140' of the sub-pixel 120' may drive the current-driving device 130' of the sub-pixel 120' through the signals transmitted through the first signal lines 111' and the second signal lines 112'.

FIG. 2B is a schematic view illustrating a circuit connection of two sub-pixels of a pixel unit in a second state according to an embodiment of the disclosure.

When the sub-pixel 120 is in a second state (or referred to as a standby or namely repair state), the sub-driving unit 160 of the sub-pixel 120 may be enabled to provide a driving potential to the current-driving device 130' of the sub-pixel 120' through the first power line 113. Besides, the primary driving unit 140 of the sub-pixel 120 is not enabled.

When the sub-pixel 120' is in the second state (or referred to as the standby or namely repair state), the primary driving unit 140' of the sub-pixel 120' may be enabled to provide a driving potential to the current-driving device 130' of the sub-pixel 120' through the first power line 113'. Besides, the sub-driving unit 160' of the sub-pixel 120' is not enabled.

For instance, a closed circuit may be formed between the sub-driving unit 160 of the sub-pixel 120 and the current-driving device 130' of the sub-pixel 120' through the sub-bridge electrode 170 of the sub-pixel 120, and an open circuit may be formed between the primary driving unit 140 of the sub-pixel 120 and the current-driving device 130 of the sub-pixel 120 through the primary bridge electrode 150 of the sub-pixel 120. As such, the sub-driving unit 160 of the sub-pixel 120 may drive the current-driving device 130' of the sub-pixel 120' through the signals transmitted through the first signal lines 111 and the second signal lines 112 but may not drive the current-driving device 130 of the sub-pixel 120.

Besides, a closed circuit may be formed between the primary driving unit 140' of the sub-pixel 120' and the current-driving device 130' of the sub-pixel 120' through the primary bridge electrode 150' of the sub-pixel 120', and an open circuit may be formed between the sub-driving unit 160' of the sub-pixel 120' and another current-driving device (not shown) of another sub-pixel (not shown) through the sub-bridge electrode 170' of the sub-pixel 120'. As such, the primary driving unit 140' of the sub-pixel 120' may drive the current-driving device 130' of the sub-pixel 120' through the signals transmitted through the first signal lines 111' and the second signal lines 112'.

In the present embodiment, the first power line 113 is, for instance, electrically connected to an operating voltage source (e.g., including but not limited to Vss), and the first power line 113' is, for instance, electrically connected to an operating voltage source, which should however not be construed as limitations in the disclosure. The operating voltage source electrically connected to the first power line 113 may be substantially the same as or different from the operating voltage source electrically connected to the first power line 113', which should not be construed as a limitation in the disclosure.

In the present embodiment, the second power line 114 is, for instance, electrically connected to a common voltage source (e.g., including but not limited to Vdd), and the second power line 114' is, for instance, electrically connected to a common voltage source, which should however not be construed as limitations in the disclosure. The common voltage source electrically connected to the second power line 114 may be substantially the same as or different from the common voltage source electrically connected to the second power line 114', which should not be construed as a limitation in the disclosure.

In the present embodiment, the primary bridge electrode 150 may be referred to as a first bridge electrode, the primary bridge electrode 150' may be referred to as a second bridge electrode, the sub-bridge electrode 170 may be referred to as a third bridge electrode, and the sub-bridge electrode 170' may be referred to as a fourth bridge electrode. When the sub-pixel 120 is in the second state (also referred to as the standby or namely repair state), in order to enable the sub-driving unit 160 of the sub-pixel 120, the open circuit formed among the sub-driving unit 160, the primary driving unit 140', and the current-driving device 130' through the sub-bridge electrode 170 may be changed to a closed circuit among the sub-driving unit 160, the primary driving unit 140', and the current-driving device 130' through the sub-bridge electrode 170 by applying a laser welding technology. When the sub-pixel 120 is in the second state (also referred to as the standby or namely repair state), in order not to enable the primary driving unit 140 of the sub-pixel 120, the closed circuit formed between the primary driving unit 140 and the current-driving device 130 through the primary bridge electrode 150 may be changed to an open circuit between the primary driving unit 140 and the current-driving device 130 through the primary bridge electrode 150 by applying a laser cutting technology. In other embodiments, to form the closed circuit or the open circuit while the sub-pixels 120, 120' are in the second state, the primary bridge electrode 150, the sub-bridge electrode 170, the primary bridge electrode 150', and/or the sub-bridge electrode 170' may be transistors (e.g., thin film transistors) or any other appropriate controllable switch device.

In the present embodiment, the primary bridge electrode 150 of the sub-pixel 120 is disposed between the primary driving unit 140 of the sub-pixel 120 and the current-driving device 130 of the sub-pixel 120, and the sub-bridge electrode 170 of the sub-pixel 120 is disposed between the sub-driving unit 160 of the sub-pixel 120 and the current-driving device 130' of the sub-pixel 120' of the same color, which should however not be construed as limitations in the disclosure. In other embodiments, the primary bridge electrode 150 of the sub-pixel 120 may be disposed in the following manner: disposed between the primary driving unit 140 of the sub-pixel 120 and the first power line 113, disposed between the primary driving unit 140 of the sub-pixel 120 and the first signal line 111, disposed between the primary driving unit 140 of the sub-pixel 120 and the second signal line 112, and/or disposed between the switch device 140*a* and the driving device 140*b* of the primary driving unit 140 of the sub-pixel 120. In other embodiments, the sub-bridge electrode 170 of the sub-pixel 120 may be disposed in the following manner: disposed between the sub-driving unit 160 of the sub-pixel 120 and the first power line 113, disposed between the sub-driving unit 160 of the sub-pixel 120 and the first signal line 111, disposed between the sub-driving unit 160 of the sub-pixel 120 and the second signal line 112, and/or disposed between the switch device 160*a* and the driving device 160*b* of the sub-driving unit 160 of the sub-pixel 120.

In the present embodiment, the primary bridge electrode 150' of the sub-pixel 120' is disposed between the primary driving unit 140' of the sub-pixel 120' and the current-driving device 130' of the sub-pixel 120', and the sub-bridge electrode 170' of the sub-pixel 120' is disposed between the sub-driving unit 160' of the sub-pixel 120' and another current-driving device (not shown) of another sub-pixel (not shown), which should however not be construed as limitations in the disclosure. In other embodiments, the primary bridge electrode 150' of the sub-pixel 120' may be disposed in the following manner: disposed between the primary driving unit 140' of the sub-pixel 120' and the first power line 113', disposed between the primary driving unit 140' of the sub-pixel 120' and the first signal line 111', disposed between the primary driving unit 140' of the sub-pixel 120' and the second signal line 112', and/or disposed between the switch device 140*a*' and the driving device 140*b*' of the primary driving unit 140' of the sub-pixel 120'. In other embodiments, the sub-bridge electrode 170' of the sub-pixel 120' may be disposed in the following manner: disposed between the sub-driving unit 160' of the sub-pixel 120' and the first power line 113', disposed between the sub-driving unit 160' of the sub-pixel 120' and the first signal line 111', disposed between the sub-driving unit 160' of the sub-pixel 120' and the second signal line 112', and/or disposed between the switch device 160*a*' and the driving device 160*b*' of the sub-driving unit 160' of the sub-pixel 120'.

In the present embodiment, the switch devices 140*a*, 160*a* and the driving devices 140*b*, 160*b* and/or the switch devices 140*a*', 160*a*' and the driving devices 140*b*', 160*b*' are n-type transistors, which should however not be construed as a limitation in the disclosure. In some embodiments, the switch devices 140*a*, 160*a* and the driving devices 140*b*, 160b and/or the switch devices 140a', 160a' and the driving devices 140b', 160b' are p-type transistors, which should however not be construed as a limitation in the disclosure. According to other embodiments, the locations of the current-driving devices 130, 130' may be adjusted in response to the types of the switch devices 140a, 160a and the driving devices 140b, 160b (e.g., p-type or n-type) and/or the types of the switch devices 140a', 160a' and the driving devices 140b, 160b' (e.g., p-type or n-type).

In light of the foregoing, when the sub-pixel 120 is in the first state (or namely the normal state), the primary driving unit 140 of the sub-pixel 120 may drive the current-driving device 130 of the sub-pixel 120, as shown in FIG. 2A. Additionally, if the current-driving device 130 of the sub-pixel 120 is damaged, is malfunctioned, has low performance, is operated in a normal manner but for a long time, or is in a similar standby state, the current-driving device 130 of the identical or substantially the same color may be driven by the sub-driving unit 160 of the sub-pixel 120, so as to reduce the chromatic aberration caused by the damage to, the malfunction of, or the low performance of the current-driving device 130, or reduce the possibility of damaging the current-driving device 130 of the sub-pixel 120 due to the normal but long-term use of the current-driving device 130.

The manner in which the pixel unit 100 is operated may be explained in the following embodiments. However, the embodiments provided herein should not be construed as limiting the protection scope in any sense.

Figure 3A:
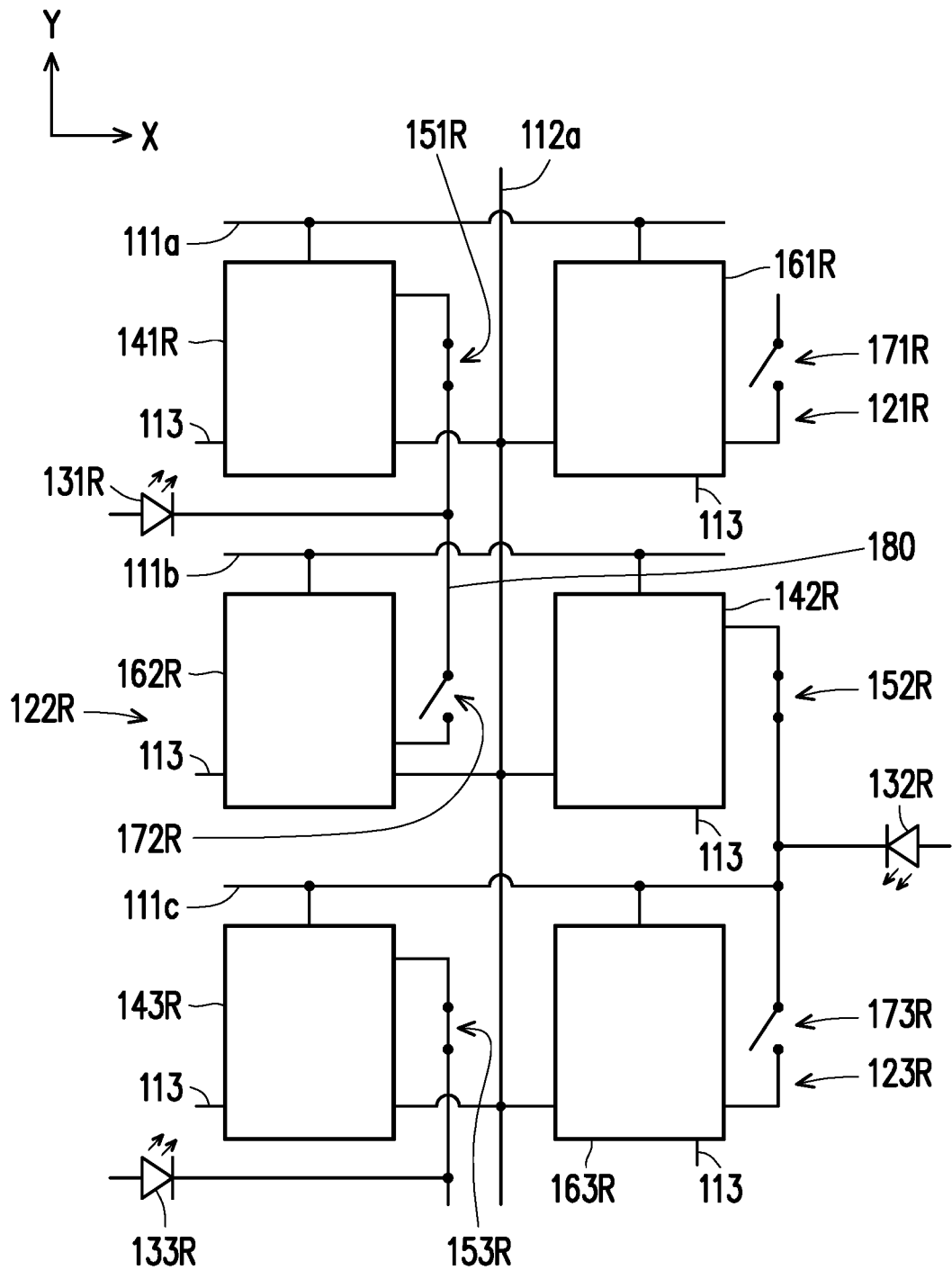
FIG. 3A is a schematic view illustrating a circuit connection of some of pixel groups of a pixel unit according to a first embodiment of the disclosure.
Figure 4A:
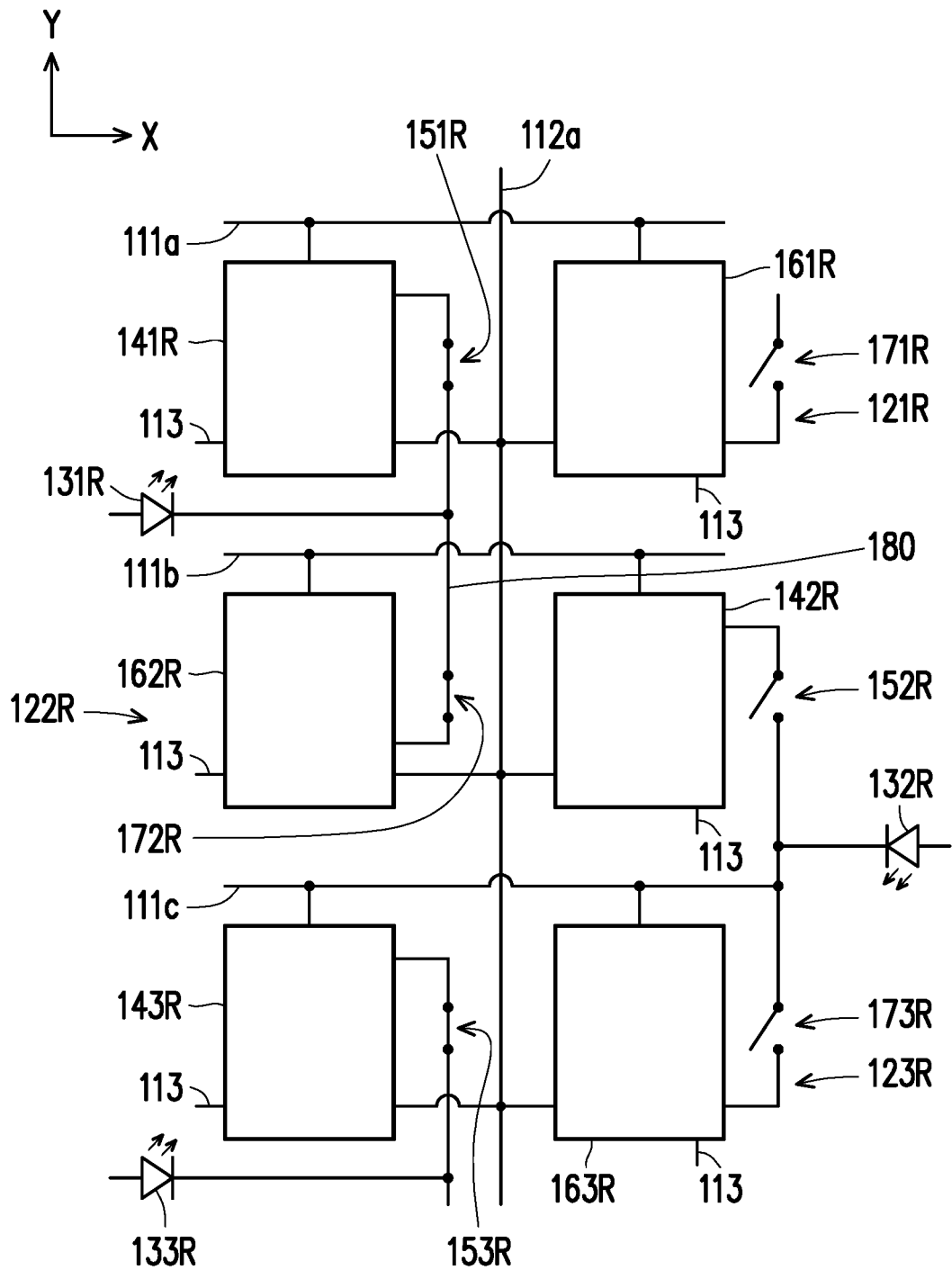
FIG. 4A is a schematic view illustrating another circuit connection of some of the pixel groups of the pixel unit according to the first embodiment of the disclosure.
Figure 5A:
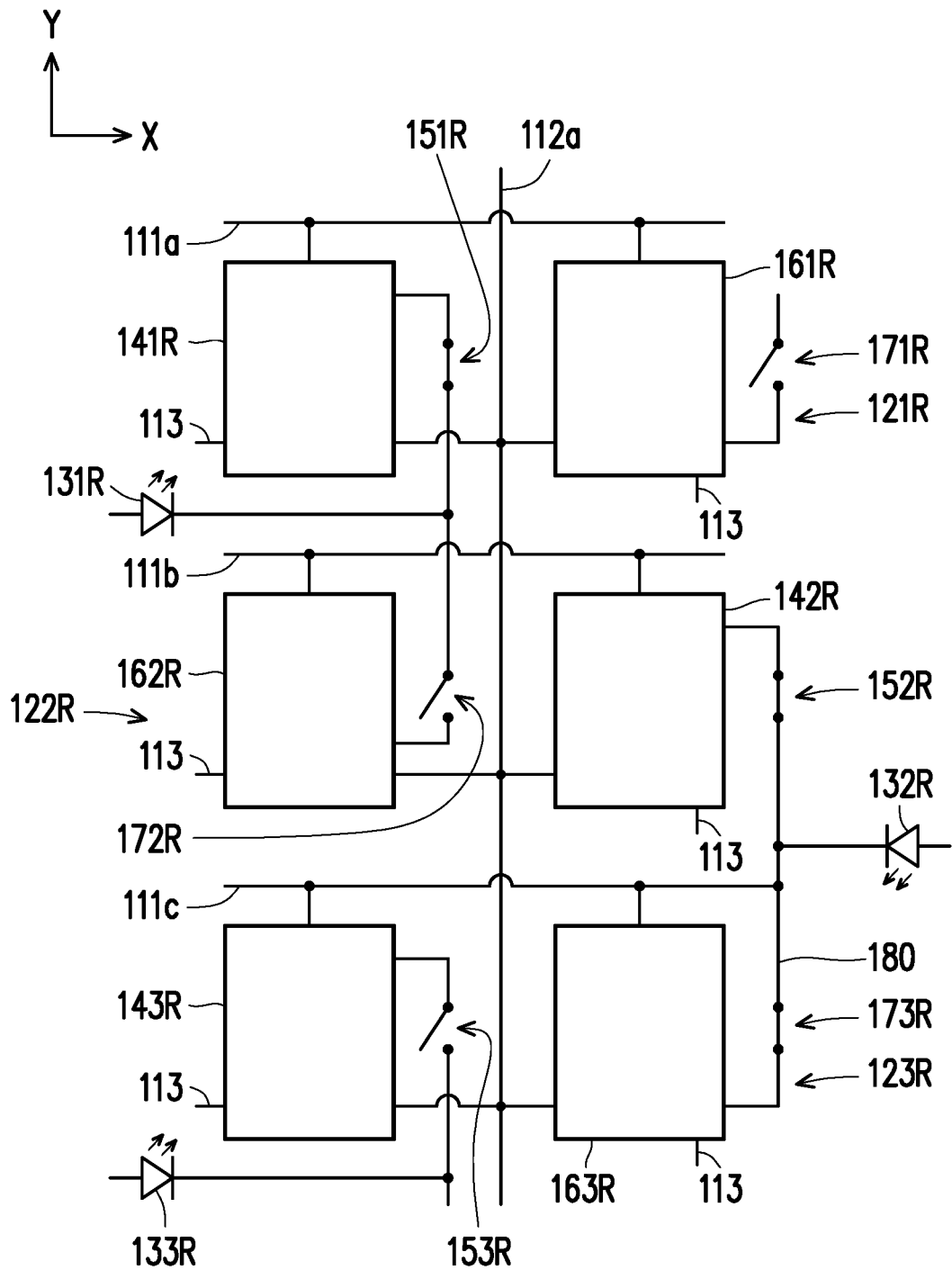
FIG. 5A is a schematic view illustrating still another circuit connection of some of the pixel groups of the pixel unit according to the first embodiment of the disclosure.

FIG. 3A is a schematic view illustrating a circuit connection of some of pixel groups of a pixel unit according to a first embodiment of the disclosure. FIG. 3B to FIG. 3D are schematic top views illustrating a display manner of some of the pixel groups of the pixel unit according to the first embodiment of the disclosure. FIG. 4A is a schematic view illustrating another circuit connection of some of the pixel groups of the pixel unit according to the first embodiment of the disclosure. FIG. 4B to FIG. 4D are schematic top views illustrating another display manner of some of the pixel groups of the pixel unit according to the first embodiment of the disclosure. FIG. 5A is a schematic view illustrating still another circuit connection of some of the pixel groups of the pixel unit according to the first embodiment of the disclosure. FIG. 5B to FIG. 5D are schematic top views illustrating still another display manner of some of the pixel groups of the pixel unit according to the first embodiment of the disclosure.

Particularly, in the first embodiment depicted in FIG. 3A to FIG. 5D, the three pixel groups PG1, PG2, and PG3 may be the pixel groups PG1, PG2, and PG3 sequentially arranged in the second direction X (shown in FIG. 1A), for instance. Besides, the schematic views of the circuit connections in FIG. 3A, FIG. 4A, and FIG. 5A may be the schematic views of the circuit connections of the first sub-pixels 121R, 122R, and 123R in the pixel groups PG1, PG2, and PG3. Given that the circuit connections of the first sub-pixels 121R, 122R, and 123R in the pixel groups PG1, PG2, and PG3 are shown in FIG. 3A, the corresponding display manner of the corresponding first current-driving devices 131R, 132R, and 133R is shown in FIG. 3B to FIG. 3D. Given that the circuit connections of the first sub-pixels 121R, 122R, and 123R in the pixel groups PG1, PG2, and PG3 are shown in FIG. 4A, the corresponding display manner of the corresponding first current-driving devices 131R, 132R, and 133R is shown in FIG. 4B to FIG. 4D. Given that the circuit connections of the first sub-pixels 121R, 122R, and 123R in the pixel groups PG1, PG2, and PG3 are shown in FIG. 5A, the corresponding display manner of the corresponding first current-driving devices 131R, 132R, and 133R is shown in FIG. 5B to FIG. 5D. Besides, as depicted in FIG. 3A, FIG. 4A, and FIG. 5A, the primary driving units 141R, 142R, 143R and the sub-driving units 161R, 162R, 163R may be staggered or alternately arranged in the first direction X and or the second direction Y, which should however not be construed as a limitation in the disclosure. In some embodiments, the primary driving units 141R, 142R, 143R and the sub-driving units 161R, 162R, 163R of the sub-pixels 121R, 122R, 123R of the same color are electrically connected to the same signal line, e.g., the same data line 112a.

Referring to FIG. 2A and FIG. 3A, in FIG. 3A, a first sub-pixel 121R and another first sub-pixel 122R are in the first state as shown in FIG. 2A. For instance, the connection or operation manner of the primary driving unit 141R, the primary bridge electrode 151R (or namely the first bridge electrode), the sub-driving unit 161R, the sub-bridge electrode 171R (or namely the third bridge electrode), and the first current-driving device 131R of the first sub-pixel 121R may be similar to the connection or operation manner of the primary driving unit 140, the primary bridge electrode 150, the sub-driving unit 160, the sub-bridge electrode 170, and the current-driving device 130 depicted in FIG. 2A and provided in the corresponding embodiment. Besides, the connection or operation manner of the primary driving unit 142R, the primary bridge electrode 152R (or namely the second bridge electrode), the sub-driving unit 162R, the sub-bridge electrode 172R (or namely the fourth bridge electrode), and the first current-driving device 132R of the first sub-pixel 122R may be similar to the connection or operation manner of the primary driving unit 140', the primary bridge electrode 150', the sub-driving unit 160', the sub-bridge electrode 170', and the current-driving device 130' provided in the previous embodiment.

For instance, the primary driving unit 141R of the first sub-pixel 121R may be enabled to provide a driving potential to the first current-driving device 131R of the first sub-pixel 121R, and the primary driving unit 142R of another first sub-pixel 122R may be enabled to provide a driving potential to the first current-driving device 132R of another first sub-pixel 122R without enabling the sub-driving unit 161R of the first sub-pixel 121R and the sub-driving unit 162R of another first sub-pixel 122R.

Another first sub-pixel 122R and still another first sub-pixel 123R are in the first state as shown in FIG. 2A. For instance, the connection or operation manner of the primary driving unit 142R, the primary bridge electrode 152R, the sub-driving unit 162R, the sub-bridge electrode 172R, and the first current-driving device 132R of another sub-pixel 122R may be similar to the connection or operation manner of the primary driving unit 140, the primary bridge electrode 150, the sub-driving unit 160, the sub-bridge electrode 170, and the current-driving device 130 depicted in FIG. 2A and provided in the corresponding embodiment. Besides, the connection or operation manner of the primary driving unit 143R, the primary bridge electrode 153R (or namely the fifth bridge electrode), the sub-driving unit 163R, the sub-bridge electrode 173R (or namely the sixth bridge electrode), and the first current-driving device 133R of still another sub-pixel 123R may be similar to the connection or operation manner of the primary driving unit 140', the primary bridge electrode 150', the sub-driving unit 160', the sub-bridge electrode 170', and the current-driving device 130' provided in the previous embodiment.

For instance, the primary driving unit 142R of the first sub-pixel 122R may be enabled to provide a driving potential to the first current-driving device 132R of the first sub-pixel 122R, and the primary driving unit 143R of the first sub-pixel 123R may be enabled to provide a driving potential to the first current-driving device 133R of the first sub-pixel 123R without enabling the sub-driving unit 162R of the first sub-pixel 122R and the sub-driving unit 163R of the first sub-pixel 123R.

According to the circuit connection shown in FIG. 3A, the corresponding display manner of the first current-driving devices 131R, 132R, and 133R may be shown in FIG. 3B to FIG. 3D.

Referring to FIG. 3A and FIG. 3B, the primary driving unit 141R of the first sub-pixel 121R may drive the first current-driving device 131R of the first sub-pixel 121R through the signals transmitted through the first signal line 111a and the second signal line 112a to emit a light L.

Referring to FIG. 3A and FIG. 3C, the primary driving unit 142R of the first sub-pixel 122R may drive the first current-driving device 132R of the first sub-pixel 122R through the signals transmitted through the first signal line 111b and the second signal line 112a to emit a light L.

According to the present embodiment, in two adjacent pixel groups, when the sub-pixels of the identical or substantially the same color are in the first state, and if the current-driving devices of the two sub-pixels are driven by the substantially identical driving potential, the brightnesses of lights emitted by the driven current-driving devices of the two sub-pixels are substantially the same. For instance, referring to FIG. 3A to FIG. 3C, in the pixel groups PG1 and PG2 shown in FIG. 3B, when the first sub-pixel 121R and another first sub-pixel 122R are in the first state, and if the first current-driving device 131R and the first current-driving device 132R are driven by the substantially identical driving potential, the brightness of the light L (as shown in FIG. 3B) emitted by the first current-driving device 131R is substantially the same as the brightness of the light L (as shown in FIG. 3C) emitted by the first current-driving device 132R.

Referring to FIG. 3A and FIG. 3D, the primary driving unit 143R of the first sub-pixel 123R may drive the first current-driving device 133R of the first sub-pixel 123R through the signals transmitted through the first signal line 111c and the second signal line 112a to emit a light L.

As provided above, according to the circuit connection shown in FIG. 3A, the first current-driving devices 131R, 132R, and 133R of the first sub-pixels 121R, 122R, and 123R may emit the light L through the signals transmitted through the first signal lines 111a, 111b, and 111c and the second signal line 112a.

Referring to FIG. 2B and FIG. 4A, in FIG. 4A, a first sub-pixel 121R and another first sub-pixel 122R are in the second state as shown in FIG. 2B. For instance, the connection or operation manner of the primary driving unit 141R, the primary bridge electrode 151R, the sub-driving unit 161R, the sub-bridge electrode 171R, and the first current-driving device 131R of the first sub-pixel 121R may be similar to the connection or operation manner of the primary driving unit 140', the primary bridge electrode 150', the sub-driving unit 160', the sub-bridge electrode 170', and the current-driving device 130' depicted in FIG. 2B and provided in the corresponding embodiment. Besides, the connection or operation manner of the primary driving unit 142R, the primary bridge electrode 152R, the sub-driving unit 162R, the sub-bridge electrode 172R, and the first current-driving device 132R of the first sub-pixel 122R may be similar to the connection or operation manner of the primary driving unit 140, the primary bridge electrode 150, the sub-driving unit 160, the sub-bridge electrode 170, and the current-driving device 130 depicted in FIG. 2B and provided in the corresponding embodiment.

For instance, the primary driving unit 141R of the first sub-pixel 121R may be enabled to provide a driving potential to the first current-driving device 131R of the first sub-pixel 121R, and the sub-driving unit 162R of another first sub-pixel 122R may be enabled to provide a driving potential to the first current-driving device 131R of the first sub-pixel 121R without enabling the sub-driving unit 161R of the first sub-pixel 121R and the primary driving unit 142R of another first sub-pixel 122R. That is, when the first sub-pixel 122R is in the second state (also referred to as the standby or namely repair state), in order to enable the sub-driving unit 162R of the first sub-pixel 122R, the open circuit formed among the sub-driving unit 162R, the primary driving unit 141R, and the current-driving device 131R through the sub-bridge electrode 172R may be changed to a closed circuit among the sub-driving unit 162R, the primary driving unit 141R, and the current-driving device 131R through the sub-bridge electrode 172R by applying a laser welding technology. When the first sub-pixel 122R is in the second state (also referred to as the standby or namely repair state), in order not to enable the primary driving unit 142R of the first sub-pixel 122R, the closed circuit formed between the primary driving unit 142R and the current-driving device 132R through the primary bridge electrode 152R may be changed to an open circuit between the primary driving unit 142R and the current-driving device 132R through the primary bridge electrode 152R by applying a laser cutting technology.

In FIG. 4A, a connection electrode 180 may be disposed between the primary driving unit 141R of the first sub-pixel 121R and the sub-driving unit 162R of another first sub-pixel 122R, and the sub-bridge electrode 172R is electrically connected to the primary bridge electrode 151R through the connection electrode 180 and may even be electrically connected to the current-driving device 131R.

Besides, according to the way to drive the first sub-pixel 123R and the connection manner thereof, the primary driving unit 143R of the first sub-pixel 123R may be enabled to provide a driving potential to the first current-driving device 133R of the first sub-pixel 123R, and the primary driving unit 142R of the first sub-pixel 122R and the sub-driving unit 163R of the first sub-pixel 123R are not enabled.

According to the circuit connection shown in FIG. 4A, the corresponding display manner of the first current-driving devices 131R, 132R, and 133R may be shown in FIG. 4B to FIG. 4D.

Referring to FIG. 4A and FIG. 4B, the primary driving unit 141R of the first sub-pixel 121R may drive the first current-driving device 131R of the first sub-pixel 121R through the signals transmitted through the first signal line 111a and the second signal line 112a to emit a light L.

Referring to FIG. 4A and FIG. 4C, the sub-driving unit 162R of the first sub-pixel 122R may drive the first current-driving device 131R of the first sub-pixel 121R through the signals transmitted through the first signal line 111b and the second signal line 112a to emit a light L. Namely, the first current-driving device 132R, the second current-driving device 132G, and the third current-driving device 132B included in the second pixel group PG2 may be changed to the first current-driving device 131R (the first pixel group PG1), the second current-driving device 132G (the second pixel group PG2), and the third current-driving device 132B (the second pixel group PG2) included in the spare pixel group PG2'.

According to the present embodiment, in two adjacent pixel groups, given that the sub-pixels of the identical or substantially the same color are in the second state and the current-driving devices of the two sub-pixels are driven by the substantially identical driving potential, if the primary driving unit of one sub-pixel and the sub-driving unit of another sub-pixel are simultaneously enabled, the brightnesses of light emitted by the driven current-driving device may be increased because the current/electrons flowing through the current-driving device of one sub-pixel may be increased, and the increased brightness is less than or substantially equal to (or namely not more than) twice the original brightness.

For instance, referring to FIG. 3A to FIG. 3B and FIG. 4A to FIG. 4C, according to the circuit connection shown in FIG. 4A, if the primary driving unit 141R of the first sub-pixel 121R and the sub-driving unit 162R of the first sub-pixel 122R are simultaneously enabled, the increase in the current/electrons flowing through the first current-driving device 131R leads to the increase in the brightness of the first current-driving device 131R in the aforesaid driving manner (e.g., the brightness of the light L emitted by the first current-driving device 131R shown in FIG. 4B is less than or substantially equal to (or namely not more than) twice the brightness of the light L emitted by the first current-driving device 131R depicted in FIG. 3B, or the sum of the brightness of the light L emitted by the first current-driving device 131R shown in FIG. 4B and the brightness of the light L emitted by the first current-driving device 131R shown in FIG. 4C).

Referring to FIG. 4A and FIG. 4D, the primary driving unit 143R of the first sub-pixel 123R may drive the first current-driving device 133R of the first sub-pixel 123R through the signals transmitted through the first signal line 111c and the second signal line 112a to emit a light L.

In view of the above, when the first current-driving device 132R of the first sub-pixel 122R is damaged, is malfunctioned, has low performance, or is operated in a normal manner but for a long time, the circuit connection shown in FIG. 4A may be applied, so that the sub-driving unit 162R of the first sub-pixel 122R may drive the first current-driving device 131R of the first sub-pixel 121R to emit the light L. Besides, the first current-driving device 132R, the second current-driving device 132G, and the third current-driving device 132B of the first sub-pixel 122R are arranged in a delta-like manner and adjacent to one another, and the first current-driving device 131R of the first sub-pixel 121R, the second current-driving device 132G of the first sub-pixel 122R, and the third current-driving device 132B of the first sub-pixel 122R are arranged in a delta-like manner and adjacent to one another. Hence, the difference in visual effects achieved by the pixel group PG2 (as shown in FIG. 3B) constituted by the first current-driving device 132R, the second current-driving device 132G, and the third current-driving device 132B of the first sub-pixel 122R and achieved by the spare pixel group PG2' (as shown in FIG. 4C) constituted by the first current-driving device 131R of the first sub-pixel 121R, the second current-driving device 132G of the first sub-pixel 122R, and the third current-driving device 132B of the first sub-pixel 122R is insignificant. Hence, the display quality of the pixel unit 100 may be improved.

Referring to FIG. 2A, FIG. 2B, and FIG. 5A, in FIG. 5A, the first sub-pixel 121R and another first sub-pixel 122R are in the first state as shown in FIG. 2A.

The first state of the first sub-pixel 121R and the first sub-pixel 122R as shown in FIG. 5A is the same as or similar to the first state of the first sub-pixel 121R and the first sub-pixels 122R as shown in FIG. 3A and therefore will not be further explained hereinafter.

Referring to FIG. 2B and FIG. 5A, in FIG. 5A, the first sub-pixel 122R and the first sub-pixel 123R are in the second state as shown in FIG. 2B. For instance, the connection or operation manner of the primary driving unit 142R, the primary bridge electrode 152R, the sub-driving unit 162R, the sub-bridge electrode 172R, and the first current-driving device 132R of the sub-pixel 122R may be similar to the connection or operation manner of the primary driving unit 140, the primary bridge electrode 150, the sub-driving unit 160, the sub-bridge electrode 170, and the current-driving device 130 depicted in FIG. 2B and provided in the corresponding embodiment. Besides, the connection or operation manner of the primary driving unit 143R, the primary bridge electrode 153R, the sub-driving unit 163R, the sub-bridge electrode 173R, and the first current-driving device 133R of the first sub-pixel 123R may be similar to the connection or operation manner of the primary driving unit 140, the primary bridge electrode 150, the sub-driving unit 160, the sub-bridge electrode 170, and the current-driving device 130 depicted in FIG. 2B and provided in the corresponding embodiment. That is, when the first sub-pixel 123R is in the second state (also referred to as the standby or namely repair state), in order to enable the sub-driving unit 163R of the first sub-pixel 122R, the open circuit formed among the sub-driving unit 163R, the primary driving unit 142R, and the current-driving device 132R through the sub-bridge electrode 173R may be changed to a closed circuit among the sub-driving unit 163R, the primary driving unit 142R, and the current-driving device 132R through the sub-bridge electrode 173R by applying a laser welding technology. When the first sub-pixel 123R is in the second state (also referred to as the standby or namely repair state), in order not to enable the primary driving unit 143R of the first sub-pixel 123R, the closed circuit formed between the primary driving unit 143R and the current-driving device 133R through the primary bridge electrode 153R may be changed to an open circuit between the primary driving unit 143R and the current-driving device 133R through the primary bridge electrode 153R by applying a laser cutting technology.

In FIG. 5A, the connection electrode 180 may be disposed between the primary driving unit 142R of the first sub-pixel 122R and the sub-driving unit 163R of the first sub-pixel 123R, and the sub-bridge electrode 173R is electrically connected to the primary bridge electrode 152R through the connection electrode 180 and may even be electrically connected to the current-driving device 132R.

According to the circuit connection shown in FIG. 5A, the corresponding display manner of the first current-driving devices 131R, 132R, and 133R may be shown in FIG. 5B to FIG. 5D.

Referring to FIG. 5A and FIG. 5B, the primary driving unit 141R of the first sub-pixel 121R may drive the first current-driving device 131R of the first sub-pixel 121R through the signals transmitted through the first signal line 111a and the second signal line 112a to emit a light L.

Referring to FIG. 5A and FIG. 5C, the primary driving unit 142R of the first sub-pixel 122R may drive the first current-driving device 132R of the first sub-pixel 122R through the signals transmitted through the first signal line 111*b* and the second signal line 112*a* to emit a light L.

Referring to FIG. 5A and FIG. 5D, the sub-driving unit 163R of the first sub-pixel 123R may drive the first current-driving device 132R of the first sub-pixel 122R through the signals transmitted through the first signal line 111*c* and the second signal line 112*a* to emit a light L. Namely, the first current-driving device 133R, the second current-driving device 133G, and the third current-driving device 133B included in the third pixel group PG3 may be changed to the first current-driving device 132R (such as in the second pixel group PG2), the second current-driving device 133G (such as in the third pixel group PG3), and the third current-driving device 133B (such as in the third pixel group PG3) included in the spare pixel group PG3'.

In view of the above, when the first current-driving device 133R of the first sub-pixel 123R is damaged, is malfunctioned, has low performance, or is operated in a normal manner but for a long time, the circuit connection shown in FIG. 5A may be applied, so that the sub-driving unit 163R of the first sub-pixel 123R may drive the first current-driving device 132R of the first sub-pixel 122R to emit the light L. Besides, the first current-driving device 133R, the second current-driving device 133G, and the third current-driving device 133B of the first sub-pixel 123R are arranged in a delta-like manner and adjacent to one another, and the first current-driving device 132R of the first sub-pixel 122R, the second current-driving device 133G of the first sub-pixel 123R, and the third current-driving device 133B of the first sub-pixel 123R are arranged in a delta-like manner and adjacent to one another. Hence, the difference in visual effects achieved by the pixel group PG3 (as shown in FIG. 3B) constituted by the first current-driving device 133R, the second current-driving device 133G, and the third current-driving device 133B of the first sub-pixel 123R and achieved by the spare pixel group PG3' constituted by the first current-driving device 132R of the first sub-pixel 122R, the second current-driving device 133G of the first sub-pixel 123R, and the third current-driving device 133B of the first sub-pixel 123R is insignificant. Hence, the display quality of the pixel unit 100 may be improved.

Figure 6A:
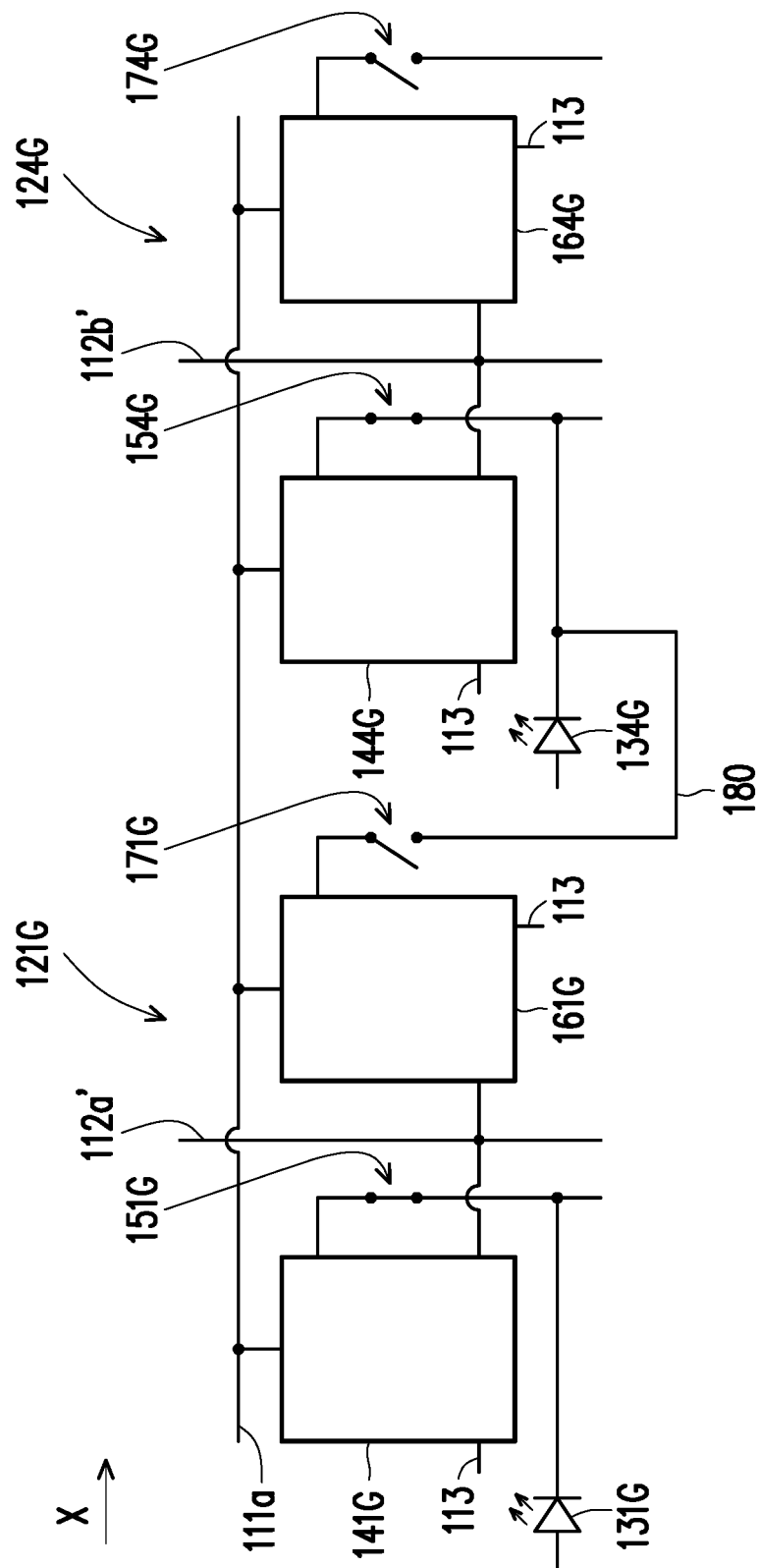
FIG. 6A is a schematic view illustrating a circuit connection of some of pixel groups of a pixel unit according to a second embodiment of the disclosure.
Figure 6B:
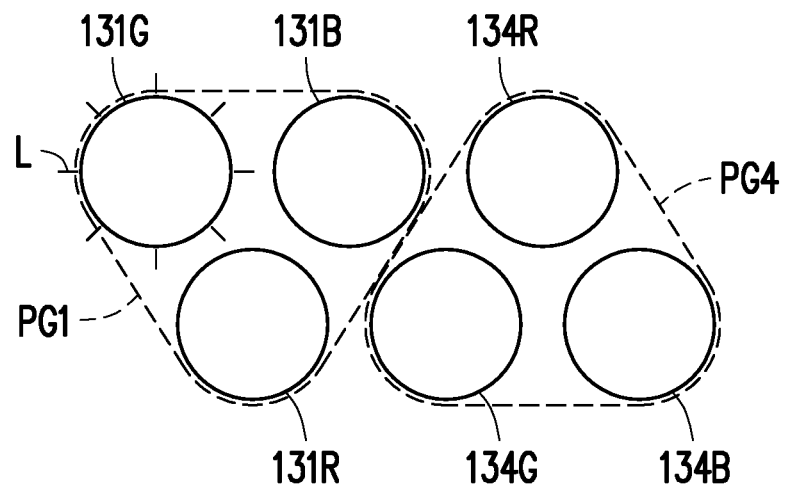
FIG. 6B and FIG. 6C are schematic top views illustrating a display manner of a portion of the pixel unit according to the second embodiment of the disclosure.
Figure 6C:
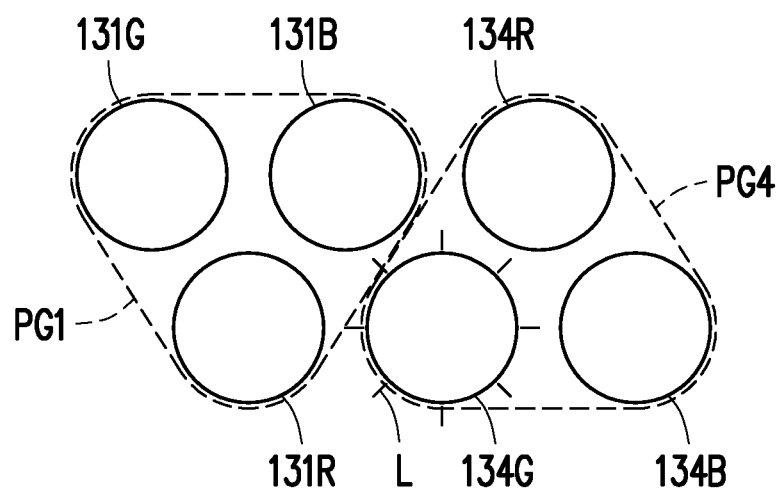
Figure 7A:
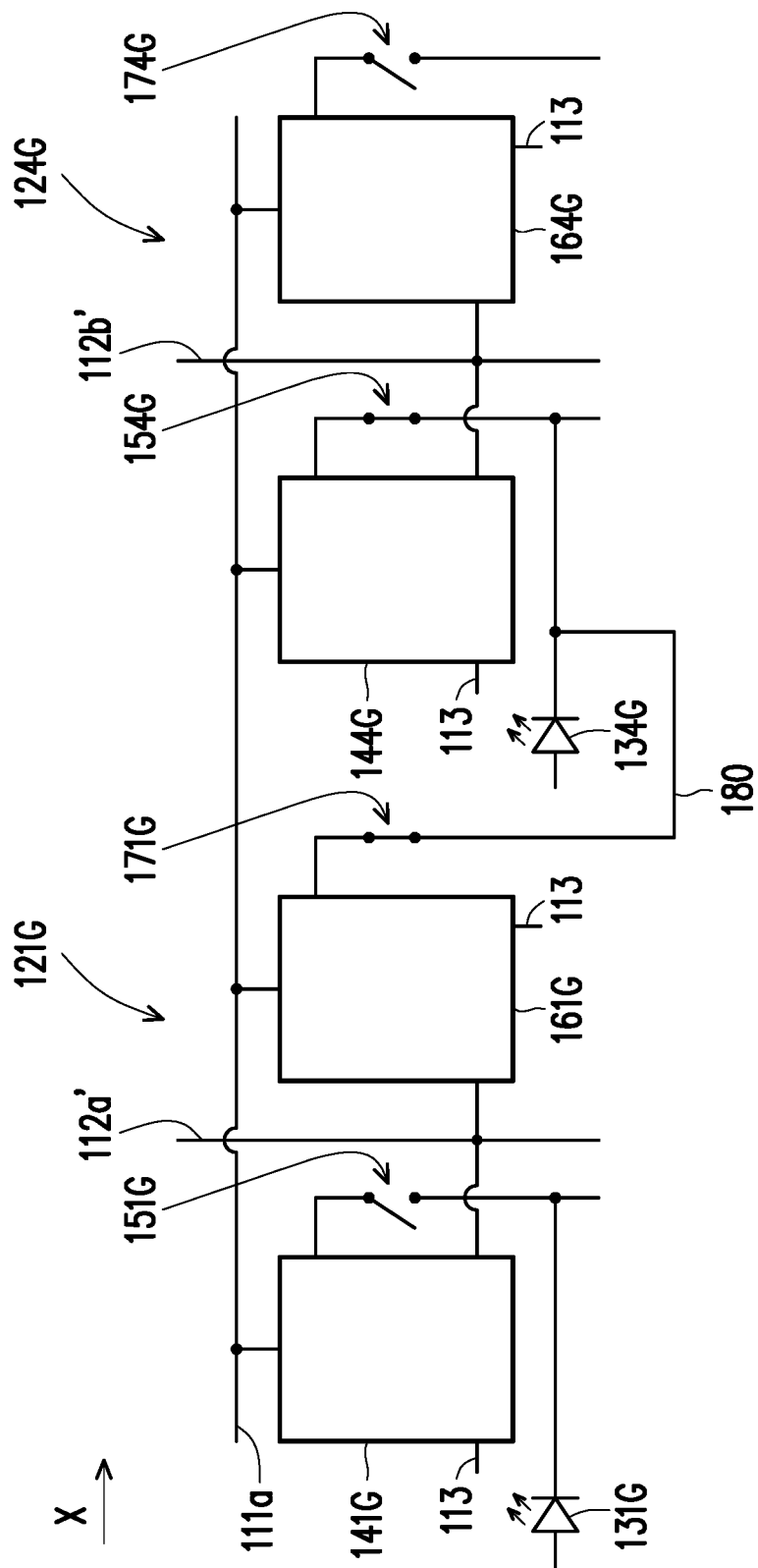
FIG. 7A is a schematic view illustrating another circuit connection of a portion of the pixel unit according to the second embodiment of the disclosure.
Figure 7B:
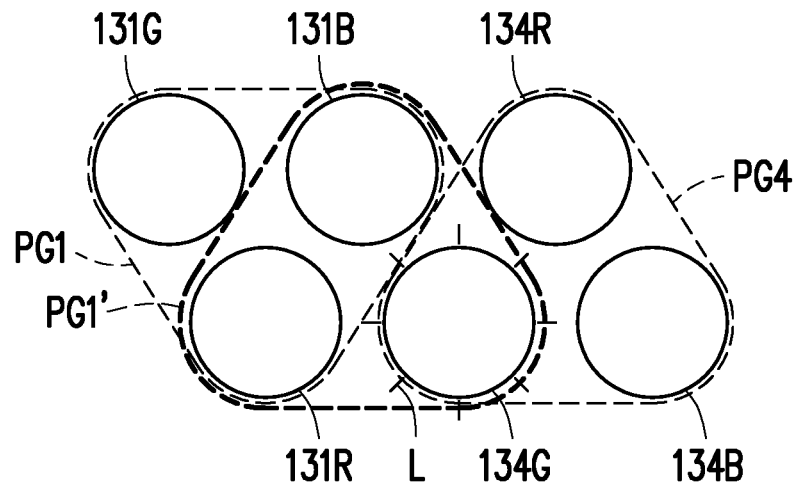
FIG. 7B and FIG. 7C are schematic top views illustrating another display manner of a portion of the pixel unit according to the second embodiment of the disclosure.
Figure 7C:
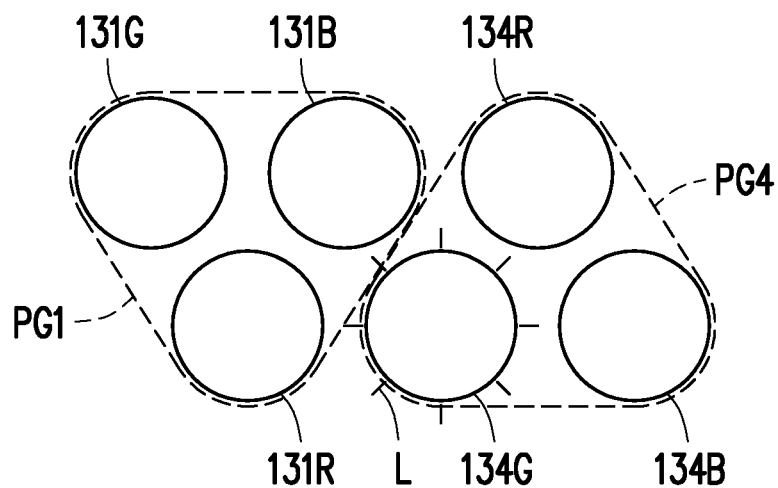

FIG. 6A is a schematic view illustrating a circuit connection of some of pixel groups of a pixel unit according to a second embodiment of the disclosure. FIG. 6B and FIG. 6C are schematic top views illustrating a display manner of some of the pixel groups of the pixel unit according to the second embodiment of the disclosure. FIG. 7A is a schematic view illustrating another circuit connection of some of the pixel groups of the pixel unit according to the second embodiment of the disclosure. FIG. 7B and FIG. 7C are schematic top views illustrating another display manner of some of the pixel groups of the pixel unit according to the second embodiment of the disclosure.

For instance, in the second embodiment depicted in FIG. 6A to FIG. 7C, the two pixel groups PG1 and PG4 may be the pixel groups PG1 and PG4 sequentially arranged in the first direction X (shown in FIG. 1A), for instance, which should however not be construed as a limitation in the disclosure. Besides, the schematic views of the circuit connections in FIG. 6A and FIG. 7A may be the schematic views of the circuit connections of the second sub-pixels 121G and 124G in the pixel groups PG1 and PG4. Besides, given that the circuit connections of the second sub-pixels 121G and 124G in the pixel groups PG1 and PG4 are shown in FIG. 6A, the corresponding display manner of the corresponding second current-driving devices 131G and 134G is shown in FIG. 6B and FIG. 6C. Given that the circuit connections of the second sub-pixels 121G and 124G in the pixel groups PG1 and PG4 are shown in FIG. 7A, the corresponding display manner of the corresponding second current-driving devices 131G and 134G is shown in FIG. 7B and FIG. 7C. Besides, as depicted in FIG. 6A and FIG. 7A, the primary driving units 141G, 144G and the sub-driving units 161G, 164G may be staggered or alternately arranged in the first direction X, which should however not be construed as a limitation in the disclosure. In some embodiments, the primary driving units 141G, 144G and the sub-driving units 161G, 164G of the sub-pixels 121G, 124G of the same color are electrically connected to the same signal line, e.g., the same scan line 112*a*.

Referring to FIG. 2A and FIG. 6A, in FIG. 6A, the second sub-pixel 121G and another second sub-pixel 124G are in the first state as shown in FIG. 2A. For instance, the connection or operation manner of the primary driving unit 141G, the primary bridge electrode 151G (or namely the first bridge electrode), the sub-driving unit 161G, the sub-bridge electrode 171G (or namely the third bridge electrode), and the first current-driving device 131G of the second sub-pixel 121G may be similar to the connection or operation manner of the primary driving unit 140, the primary bridge electrode 150, the sub-driving unit 160, the sub-bridge electrode 170, and the current-driving device 130 depicted in FIG. 2A and provided in the corresponding embodiment. Besides, the connection or operation manner of the primary driving unit 144G, the primary bridge electrode 154G (or namely the second bridge electrode), the sub-driving unit 164G, the sub-bridge electrode 174G (or namely the fourth bridge electrode), and the first current-driving device 134G of the first sub-pixel 124G may be similar to the connection or operation manner of the primary driving unit 140', the primary bridge electrode 150', the sub-driving unit 160', the sub-bridge electrode 170', and the current-driving device 130' provided in the previous embodiment.

For instance, the primary driving unit 141G of the second sub-pixel 121G may be enabled to provide a driving potential to the second current-driving device 131G of the second sub-pixel 121G, and the primary driving unit 144G of another first sub-pixel 124G may be enabled to provide a driving potential to the second current-driving device 134G of another first sub-pixel 124G without enabling the sub-driving unit 164G of the second sub-pixel 121G and the sub-driving unit 164G of another second sub-pixel 124G.

According to the circuit connection shown in FIG. 6A, the corresponding display manner of the second current-driving devices 131G and 134G may be shown in FIG. 6B and FIG. 6C.

Referring to FIG. 6A and FIG. 6B, the primary driving unit 141G of the second sub-pixel 121G may drive the second current-driving device 131G of the second sub-pixel 121G through the signals transmitted through the first signal line 111*a* and the second signal line 112*a*' to emit a light L.

Referring to FIG. 6A and FIG. 6C, the primary driving unit 144G of the second sub-pixel 124G may drive the second current-driving device 134G of the second sub-pixel 124G through the signals transmitted through the first signal line 111*a* and the second signal line 112*b*' to emit a light L.

As provided above, according to the circuit connection shown in FIG. 6A, the second current-driving devices 131G and 134G of the second sub-pixels 121G and 124G may emit the light L through the signals transmitted through the first signal line 111*a* and the second signal lines 112*a*' and 112*b*'.

Referring to FIG. 2B and FIG. 7A, in FIG. 7A, the second sub-pixel 121G and another second sub-pixel 124G are in the second state as shown in FIG. 2B. For instance, the connection or operation manner of the primary driving unit 141G, the primary bridge electrode 151G, the sub-driving unit 161G, the sub-bridge electrode 171G, and the first current-driving device 131G of the second sub-pixel 121G may be similar to the connection or operation manner of the primary driving unit 140, the primary bridge electrode 150, the sub-driving unit 160, the sub-bridge electrode 170, and the current-driving device 130 depicted in FIG. 2B and provided in the corresponding embodiment. Besides, the connection or operation manner of the primary driving unit 144G, the primary bridge electrode 154G, the sub-driving unit 164G, the sub-bridge electrode 174G, and the first current-driving device 134G of the second sub-pixel 124G may be similar to the connection or operation manner of the primary driving unit 140, the primary bridge electrode 150, the sub-driving unit 160, the sub-bridge electrode 170, and the current-driving device 130 depicted in FIG. 2B and provided in the corresponding embodiment.

For instance, the sub-driving unit 161G of the second sub-pixel 121G may be enabled to provide a driving potential to the second current-driving device 134G of the second sub-pixel 124G, and the primary driving unit 144G of another second sub-pixel 124G may be enabled to provide a driving potential to the second current-driving device 134G of another second sub-pixel 124G without enabling the primary driving unit 141G of the second sub-pixel 121G and the sub-driving unit 164G of another second sub-pixel 124G. Namely, when the second sub-pixel 121G is in the second state (also referred to as the standby or namely repair state), in order to enable the sub-driving unit 161G of the second sub-pixel 121G, the open circuit formed among the sub-driving unit 161G, the primary driving unit 144G, and the current-driving device 134G through the sub-bridge electrode 171G may be changed to a closed circuit among the sub-driving unit 161G, the primary driving unit 144G, and the current-driving device 134G through the sub-bridge electrode 171G by applying a laser welding technology. When the second sub-pixel 121G is in the second state (also referred to as the standby or namely repair state), in order not to enable the primary driving unit 141G of the second sub-pixel 121G, the closed circuit formed between the primary driving unit 141G and the current-driving device 131G through the primary bridge electrode 151G may be changed to an open circuit between the primary driving unit 141G and the current-driving device 131G through the primary bridge electrode 151G by applying a laser cutting technology.

In FIG. 7A, the connection electrode 180 may be disposed between the primary driving unit 144G of the second sub-pixel 124G and the sub-driving unit 161G of the second sub-pixel 121G, and the sub-bridge electrode 171G is electrically connected to the primary bridge electrode 154G through the connection electrode 180 and may even be electrically connected to the current-driving device 134G.

According to the circuit connection shown in FIG. 7A, the corresponding display manner of the second current-driving devices 131G and 134G may be shown in FIG. 7B and FIG. 7C.

Referring to FIG. 7A and FIG. 7B, the sub-driving unit 161G of the second sub-pixel 121G may drive the second current-driving device 134G of the second sub-pixel 124G through the signals transmitted through the first signal line 111a and the second signal line 112a' to emit a light L.

Referring to FIG. 7A and FIG. 7C, the primary driving unit 144G of the second sub-pixel 124G may drive the second current-driving device 134G of the second sub-pixel 124G through the signals transmitted through the first signal line 111a and the second signal line 112b' to emit a light L. Namely, the first current-driving device 131R, the second current-driving device 131G, and the third current-driving device 131B included in the first pixel group PG1 may be changed to the first current-driving device 131R (such as in the first pixel group PG1), the second current-driving device 134G (such as in the fourth pixel group PG4), and the third current-driving device 131B (such as in the first pixel group PG1) included in the spare pixel group PG1'.

In view of the above, when the second current-driving device 131G of the second sub-pixel 121G is damaged, is malfunctioned, has low performance, or is operated in a normal manner but for a long time, the circuit connection shown in FIG. 7A may be applied, so that the sub-driving unit 161G of the second sub-pixel 121G may drive the second current-driving device 134G of the second sub-pixel 124G to emit the light L. Besides, the first current-driving device 131R of the first sub-pixel 121R, the second current-driving device 131G of the second sub-pixel 121G, and the third current-driving device 131B of the third sub-pixel 121B are arranged in a delta-like manner and adjacent to one another, and the first current-driving device 131R of the first sub-pixel 121R, the second current-driving device 134G of the second sub-pixel 124G, and the third current-driving device 131B of the third sub-pixel 121B are arranged in a delta-like manner and adjacent to one another. Hence, the difference in visual effects achieved by the pixel group PG1 (as shown in FIG. 6B) constituted by the first current-driving device 131R of the first sub-pixel 121R, the second current-driving device 131G of the second sub-pixel 121G, and the third current-driving device 131B of the third sub-pixel 121B and achieved by the spare pixel group PG1' constituted by the first current-driving device 131R of the first sub-pixel 121R, the second current-driving device 134G of the second sub-pixel 124G, and the third current-driving device 131B of the third sub-pixel 121B is insignificant. Hence, the display quality of the pixel unit 100 may be improved.

Figure 8A:
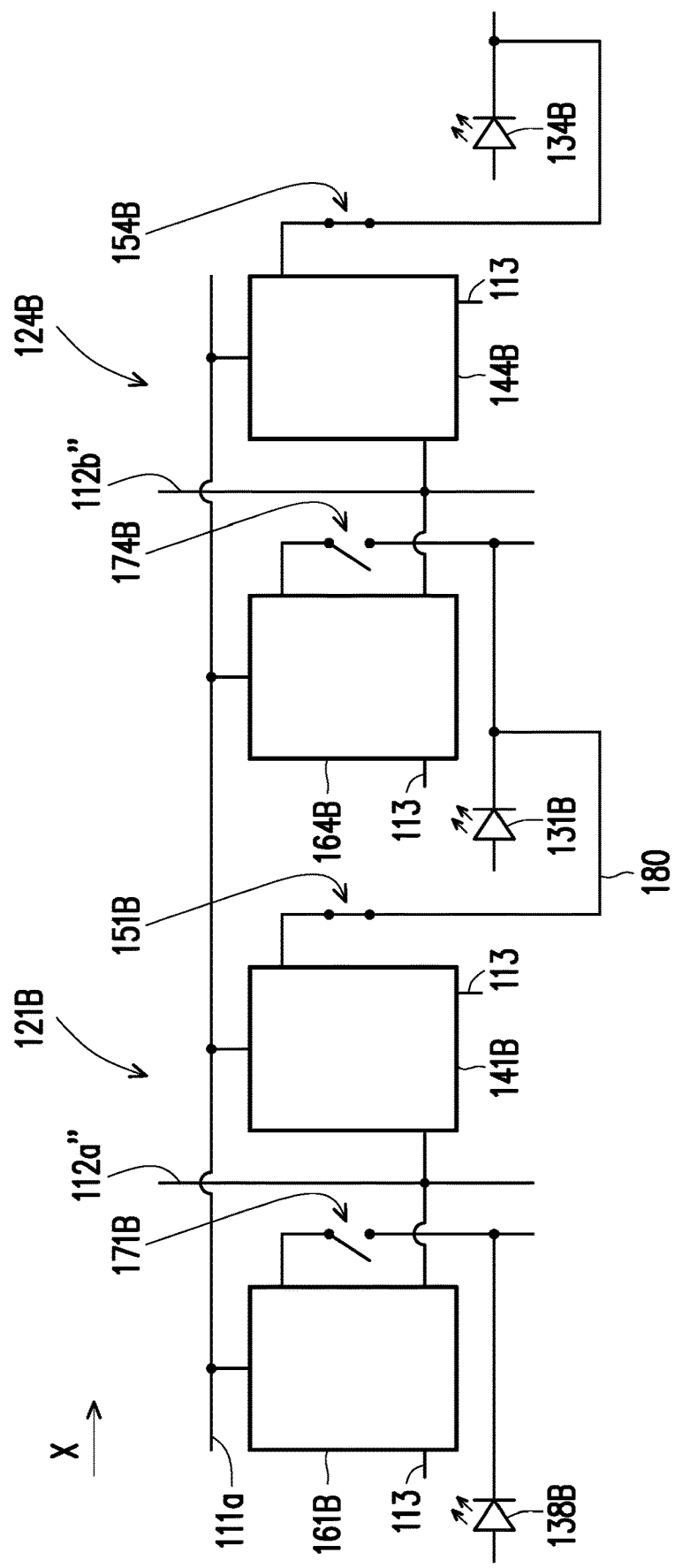
FIG. 8A is a schematic view illustrating a circuit connection of a portion of a pixel unit according to a third embodiment of the disclosure.
Figure 8B:
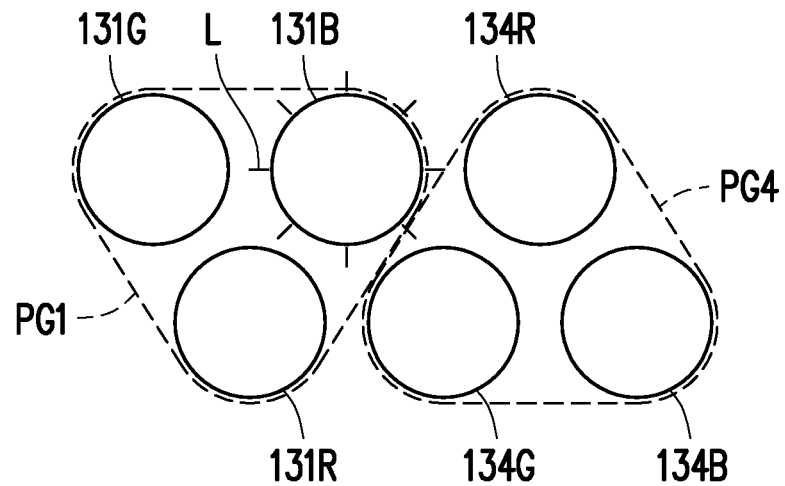
FIG. 8B and FIG. 8C are schematic top views illustrating a display manner of a portion of the pixel unit according to the third embodiment of the disclosure.
Figure 8C:
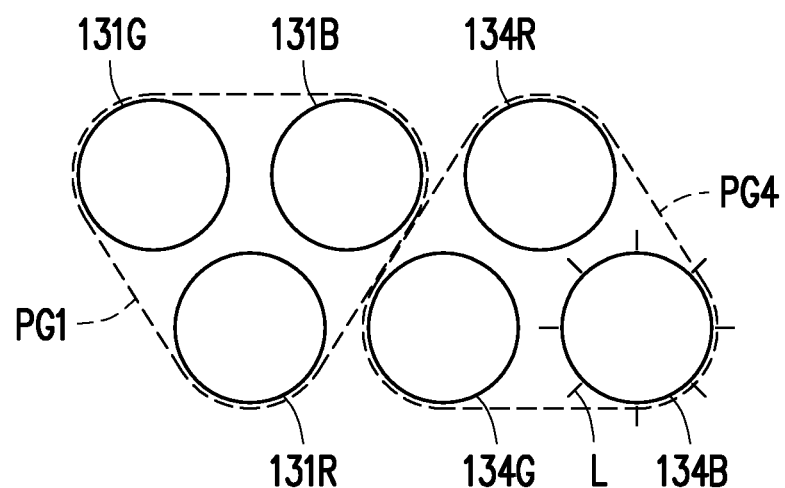
Figure 9A:
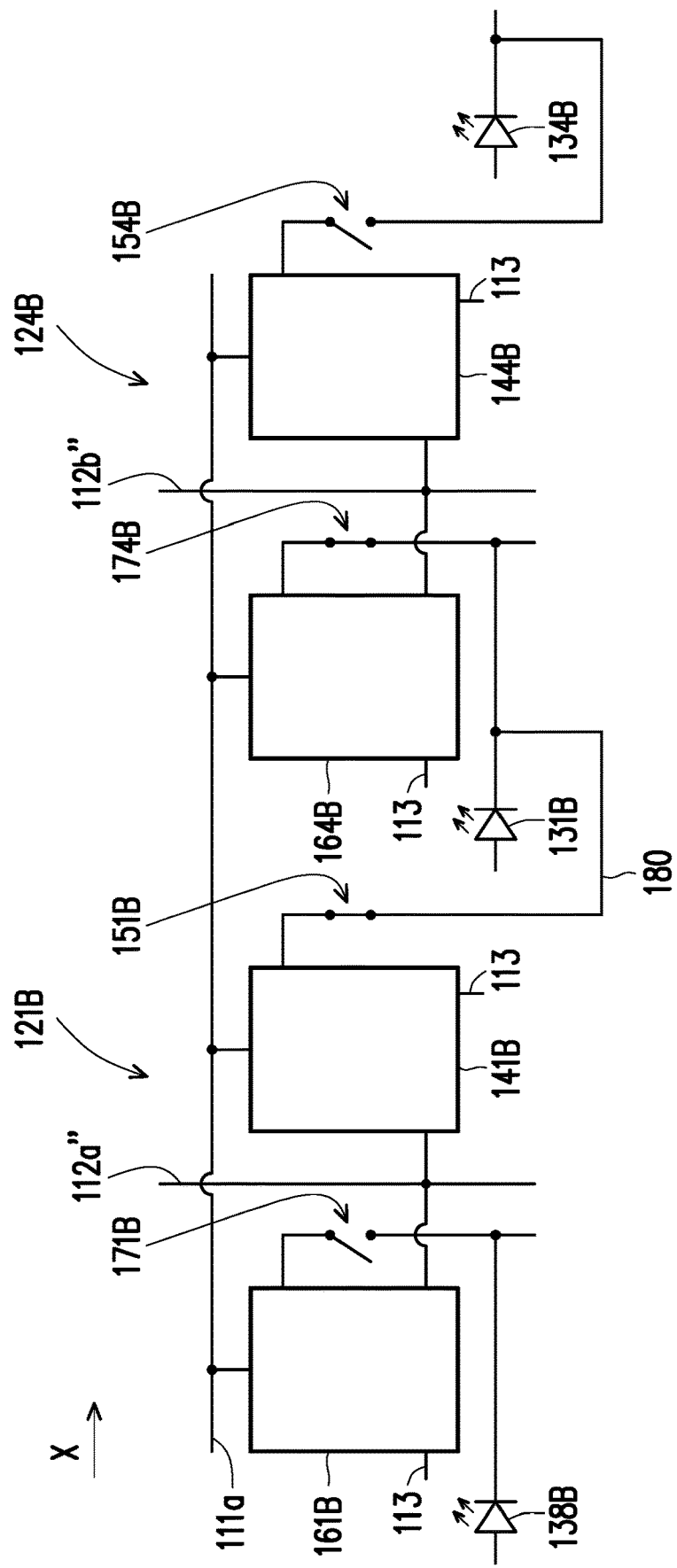
FIG. 9A is a schematic view illustrating another circuit connection of a portion of the pixel unit according to the third embodiment of the disclosure.
Figure 9B:
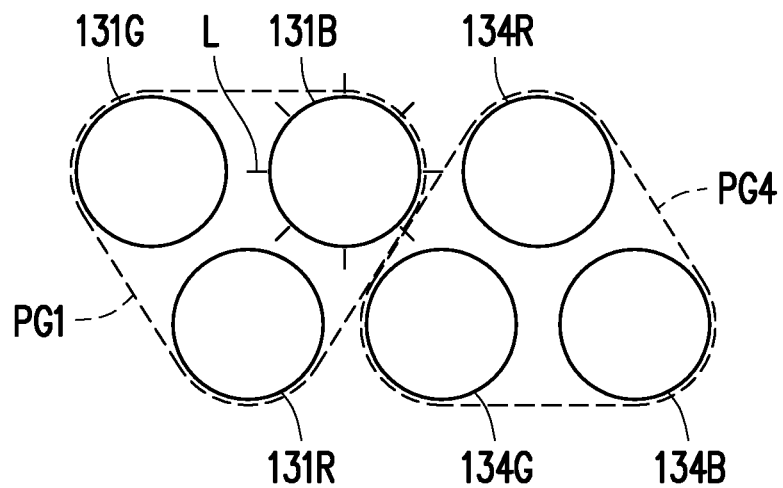
FIG. 9B and FIG. 9C are schematic top views illustrating another display manner of a portion of the pixel unit according to the third embodiment of the disclosure.
Figure 9C:
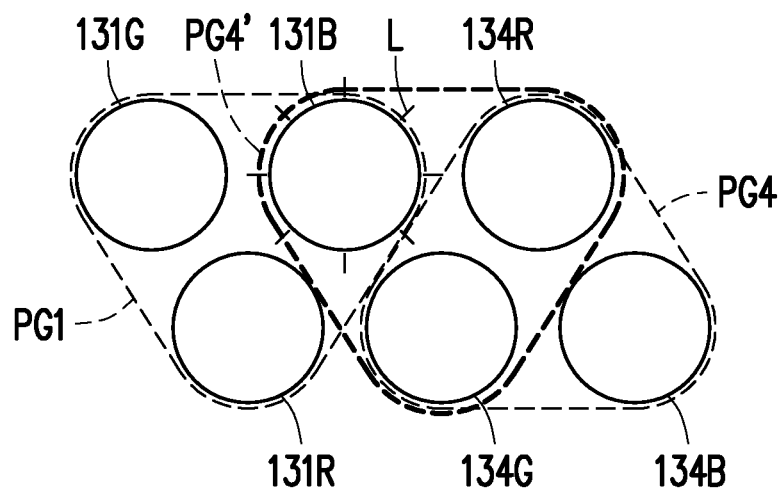

FIG. 8A is a schematic view illustrating a circuit connection of some of pixel groups of a pixel unit according to a third embodiment of the disclosure. FIG. 8B and FIG. 8C are schematic top views illustrating a display manner of some of the pixel groups of the pixel unit according to the third embodiment of the disclosure. FIG. 9A is a schematic view illustrating another circuit connection of some of the pixel groups of the pixel unit according to the third embodiment of the disclosure. FIG. 9B and FIG. 9C are schematic top views illustrating another display manner of some of the pixel groups of the pixel unit according to the third embodiment of the disclosure.

For instance, in the third embodiment depicted in FIG. 8A to FIG. 9C, the two pixel groups PG1 and PG4 may be the pixel groups PG1 and PG4 sequentially arranged in the first direction X (shown in FIG. 1A), for instance. Besides, the schematic views of the circuit connections in FIG. 8A and FIG. 9A may be the schematic views of the circuit connections of the third sub-pixels 121B and 124B in the pixel groups PG1 and PG4. Besides, given that the circuit connections of the third sub-pixels 121B and 124B in the pixel groups PG1 and PG4 are shown in FIG. 8A, the corresponding display manner of the corresponding third current-driving devices 131B and 134B is shown in FIG. 8B to FIG. 8D. Given that the circuit connections of the third sub-pixels 121B and 124B in the pixel groups PG1 and PG4 are shown in FIG. 9A, the corresponding display manner of the corresponding third current-driving devices 131B and 134B is shown in FIG. 9B and FIG. 9C. Besides, as depicted in FIG. 8A and FIG. 9A, the primary driving units 141B, 144B and the sub-driving units 161B, 164B may be staggered or alternately arranged in the first direction X, which should however not be construed as a limitation in the disclosure. In some embodiments, the primary driving units 141B, 144B and the sub-driving units 161B, 164B of the sub-pixels 121B, 124B of the same color are electrically connected to the same signal line, e.g., the same scan line 111a.

Referring to FIG. 2A and FIG. 8A, in FIG. 8A, a third sub-pixel 121B and another third sub-pixel 124B are in the first state as shown in FIG. 2A. For instance, the connection or operation manner of the primary driving unit 141B, the primary bridge electrode 151B (or namely the first bridge electrode), the sub-driving unit 161B, the sub-bridge electrode 171B (or namely the fourth bridge electrode), and the first current-driving device 131B of the third sub-pixel 121B may be similar to the connection or operation manner of the primary driving unit 140, the primary bridge electrode 150, the sub-driving unit 160, the sub-bridge electrode 170, and the current-driving device 130 depicted in FIG. 2A and provided in the corresponding embodiment. Besides, the connection or operation manner of the primary driving unit 144B, the primary bridge electrode 154B (or namely the second bridge electrode), the sub-driving unit 164B, the sub-bridge electrode 174B (or namely the third bridge electrode), and the first current-driving device 134B of the third sub-pixel 124B may be similar to the connection or operation manner of the primary driving unit 140', the primary bridge electrode 150', the sub-driving unit 160', the sub-bridge electrode 170', and the current-driving device 130' provided in the previous embodiment.

For instance, the primary driving unit 141B of the third sub-pixel 121B may be enabled to provide a driving potential to the third current-driving device 131B of the third sub-pixel 121B, and the primary driving unit 144B of another third sub-pixel 124B may be enabled to provide a driving potential to the third current-driving device 134B of another third sub-pixel 124B without enabling the sub-driving unit 161B of the third sub-pixel 121B and the sub-driving unit 164B of another third sub-pixel 124B.

According to the circuit connection shown in FIG. 8A, the corresponding display manner of the third current-driving devices 131B and 134B may be shown in FIG. 8B and FIG. 8C.

Referring to FIG. 8A and FIG. 8B, the primary driving unit 141B of the third sub-pixel 121B may drive the third current-driving device 131B of the third sub-pixel 121B through the signals transmitted through the first signal line 111a and the second signal line 112a" to emit a light L.

Referring to FIG. 8A and FIG. 8C, the primary driving unit 144B of the third sub-pixel 124B may drive the third current-driving device 134B of the third sub-pixel 124B through the signals transmitted through the first signal line 111a and the second signal line 112b" to emit a light L.

As provided above, according to the circuit connection shown in FIG. 8A, the third current-driving devices 131B and 134BG of the third sub-pixels 121B and 124B may emit the light L through the signals transmitted through the first signal line 111a and the second signal lines 112a" and 112b".

Referring to FIG. 2B and FIG. 9A, in FIG. 9A, a third sub-pixel 121B and another third sub-pixel 124B are in the second state as shown in FIG. 2B. For instance, the connection or operation manner of the primary driving unit 141B, the primary bridge electrode 151B, the sub-driving unit 161B, the sub-bridge electrode 171B, and the first current-driving device 131B of the third sub-pixel 121B may be similar to the connection or operation manner of the primary driving unit 140', the primary bridge electrode 150', the sub-driving unit 160', the sub-bridge electrode 170', and the current-driving device 130' depicted in FIG. 2B and provided in the corresponding embodiment. Besides, the connection or operation manner of the primary driving unit 144B, the primary bridge electrode 154B, the sub-driving unit 164B, the sub-bridge electrode 174B, and the first current-driving device 134B of the third sub-pixel 124B may be similar to the connection or operation manner of the primary driving unit 140, the primary bridge electrode 150, the sub-driving unit 160, the sub-bridge electrode 170, and the current-driving device 130 depicted in FIG. 2B provided in the previous embodiment.

For instance, the primary driving unit 141B of the third sub-pixel 121B may be enabled to provide a driving potential to the third current-driving device 131B of the third sub-pixel 121B, and the sub-driving unit 164B of another third sub-pixel 124B may be enabled to provide a driving potential to the third current-driving device 131B of another third sub-pixel 121B without enabling the sub-driving unit 161B of the third sub-pixel 121B and the primary driving unit 144B of another third sub-pixel 124B. When the third sub-pixel 124B is in the second state (also referred to as the standby or namely repair state), in order to enable the sub-driving unit 164B of the third sub-pixel 124B, the open circuit formed among the sub-driving unit 164B, the primary driving unit 141B, and the current-driving device 131B through the sub-bridge electrode 174B may be changed to a closed circuit among the sub-driving unit 164B, the primary driving unit 141B, and the current-driving device 131B through the sub-bridge electrode 174B by applying a laser welding technology. When the third sub-pixel 124B is in the second state (also referred to as the standby or namely repair state), in order not to enable the primary driving unit 144B of the third sub-pixel 124B, the closed circuit formed between the primary driving unit 144B and the current-driving device 134B through the primary bridge electrode 154B may be changed to an open circuit between the primary driving unit 144B and the current-driving device 134B through the primary bridge electrode 154B by applying a laser cutting technology.

In FIG. 9A, the connection electrode 180 may be disposed between the primary driving unit 141B of the third sub-pixel 121B and the sub-driving unit 164B of the third sub-pixel 124B, and the sub-bridge electrode 174B is electrically connected to the primary bridge electrode 151B through the connection electrode 180 and may even be electrically connected to the current-driving device 131B.

According to the circuit connection shown in FIG. 9A, the corresponding display manner of the third current-driving devices 131B and 134B may be shown in FIG. 9B and FIG. 9C.

Referring to FIG. 9A and FIG. 9B, the primary driving unit 141B of the third sub-pixel 121B may drive the third current-driving device 131B of the third sub-pixel 124B through the signals transmitted through the first signal line 111a and the second signal line 112a" to emit a light L.

Referring to FIG. 9A and FIG. 9C, the primary driving unit 164B of the third sub-pixel 124B may drive the third current-driving device 131B of the third sub-pixel 121B through the signals transmitted through the first signal line 111a and the second signal line 112b" to emit a light L. Namely, the first current-driving device 134R, the second current-driving device 134G, and the third current-driving device 134B included in the fourth pixel group PG4 may be changed to the first current-driving device 134R (such as in the fourth pixel group PG1), the second current-driving device 134G (such as in the fourth pixel group PG4), and the third current-driving device 131B (such as in the first pixel group PG1) included in the spare pixel group PG4'.

In view of the above, when the third current-driving device 134B of the third sub-pixel 124B is damaged, is malfunctioned, has low performance, or is operated in a normal manner but for a long time, the circuit connection shown in FIG. 9A may be applied, so that the sub-driving unit 164B of the third sub-pixel 124B may drive the third current-driving device 131B of the third sub-pixel 121B to emit the light L. Besides, the first current-driving device 134R of the first sub-pixel 124R, the second current-driving device 134G of the second sub-pixel 124G, and the third current-driving device 134B of the third sub-pixel 134B are arranged in a delta-like manner and adjacent to one another, and the first current-driving device 134R of the first sub-pixel 124R, the second current-driving device 134G of the second sub-pixel 124G, and the third current-driving device 131B of the third sub-pixel 121B are arranged in a delta-like manner and adjacent to one another. Hence, the difference in visual effects achieved by the pixel group PG4 (as shown in FIG. 8B) constituted by the first current-driving device 134R of the first sub-pixel 124R, the second current-driving device 134G of the second sub-pixel 124G, and the third current-driving device 134B of the third sub-pixel 124B and achieved by the spare pixel group PG4' constituted by the first current-driving device 134R of the first sub-pixel 124R, the second current-driving device 134G of the second sub-pixel 124G, and the third current-driving device 131B of the third sub-pixel 121B is insignificant. Hence, the display quality of the pixel unit 100 may be improved.

The micro light emitting devices provided in the foregoing embodiments (e.g., the micro light emitting devices that may be included in the current-driving devices 130) are, for instance, smaller than 100 μm, preferably smaller than 50 μm but larger than 0 μm. For instance, the micro light emitting devices may be organic light emitting devices or inorganic light emitting devices, preferably the inorganic light emitting devices, which should however not be construed as a limitation in the disclosure. Structurally, the micro light emitting devices may be P-N diodes, P-I-N diodes, or may have other appropriate structures. Besides, the micro light emitting devices may be vertical type-micro light emitting devices, horizontal type-micro light emitting devices, or flipchip type-micro light emitting devices. The micro light emitting devices may be made of an organic material (e.g., an organic polymer luminescent material, an organic small molecule luminescent material, an organic luminescent material, another suitable material, or a combination thereof), an inorganic material (e.g., a perovskite material, a rare earth ion luminescent material, a rare earth fluorescent material, a semiconductor luminescent material, another suitable material, or a combination thereof), another suitable material, or a combination of the foregoing materials.

In the previous embodiments, at least one of the switch device (e.g., the switch device 140a or 160a) and the driving device (e.g., the driving device 140b or 160b) may be a thin film transistor (TFT), such as a bottom gate transistor, a top gate transistor, a three-dimensional transistor, or another appropriate transistor. A gate electrode of the bottom gate transistor may be located below a semiconductor layer (not shown), a gate electrode of the top gate transistor may be located above a semiconductor layer (not shown), and a channel of a semiconductor layer (not shown) of the three-dimensional transistor is extended and not located on a plane. The semiconductor layer (not shown) may be of a single-layer structure or a multi-layer structure, and a material of the semiconductor layer includes amorphous silicon, microcrystalline silicon, nanocrystalline silicon, polysilicon, monocrystalline silicon, an organic semiconductor material, an oxide semiconductor material, a carbon nanotube/nanorod, a perovskite material, another suitable material, or a combination of the foregoing materials.

Besides, the switch device (e.g., the switch device 140a or 160a), the driving device (e.g., the driving device 140b or 160b), and the capacitor (not shown) may be simply referred to as two active devices and one capacitor (as 2T1C). In other embodiments, at least one of the primary driving unit (e.g., the primary driving unit 140) and the sub-driving unit (e.g., the sub-driving unit 160) of each sub-pixel (e.g., the sub-pixel 120) may include other active devices, and the number of the switch device (e.g., the switch device 140a or 160a), the driving device (e.g., the driving device 140b or 160b), other active devices, and the capacitor(s) included in the at least one of the primary driving unit (e.g., the primary driving unit 140) and the sub-driving unit (e.g., the sub-driving unit 160) may vary according to actual design, so that the switch device, the driving device, other active devices, and the capacitor (s) may be simply referred to as three active devices and one or two capacitors (as 3T1C/2C), four active devices and one or two capacitors (as 4T1C/2C), five active devices and one or two capacitors (as 5T1C/2C), six active devices and one or two capacitors (as 6T1C/2C), or any other appropriate circuit configuration.

To sum up, in the pixel unit provided in one or more exemplary embodiments, when the current-driving device of one of the sub-pixels in a pixel group is damaged, is malfunctioned, has low performance, is operated in a normal manner but for a long time, or is in a similar standby state, the current-driving device of the sub-pixel of the same color in an adjacent pixel group and the current-driving device of the sub-pixel of a different color in the original pixel group may constitute a spare pixel group. The difference in visual effects achieved by the current-driving devices of the sub-pixels of different colors in the original pixel group and by the current-driving devices of the sub-pixels of different colors in the spare pixel group is insignificant. Hence, the display quality of the pixel unit may be improved.

Although the disclosure has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:
1. A pixel unit comprising:
a plurality of signal lines; and
at least two pixel groups respectively corresponding to and electrically connected to the signal lines, wherein each of the pixel groups has three sub-pixels of different colors, two of the sub-pixels of a same color are respectively located in different pixel groups of the pixel groups, and each of the sub-pixels of the same color have a primary driving unit, a sub-driving unit, and a current-driving device, wherein
when in a first state, the primary driving unit of one of the sub-pixels of the same color is enabled to provide a driving potential to the current-driving device of the one of the sub-pixels of the same color, and the primary driving unit of the other one of the sub-pixels of the same color is enabled to provide the driving potential to the current-driving device of the other one of the sub-pixels of the same color, but without enabling the sub-driving units of the sub-pixels of the same color; and when in a second state, the primary driving unit of the one of the sub-pixels of the same color and the sub-driving unit of the other one of the sub-pixels of the same color are enabled to provide the driving potential to the current-driving device of the one of the sub-pixels of the same color, but without enabling the sub-driving unit of the one of the sub-pixels of the same color and the primary driving unit of the other one of the sub-pixels of the same color, wherein the current-driving device comprises a micro light emitting device.

2. The pixel unit of claim 1, wherein the primary driving units and the sub-driving units of the sub-pixels of the same color are both electrically connected to a same signal line of the signal lines.

3. The pixel unit of claim 2, wherein the same signal line is a data line.

4. The pixel unit of claim 2, wherein the same signal line is a scan line.

5. The pixel unit of claim 1, wherein the primary driving units and the sub-driving units of the sub-pixels are staggered arrangement.

6. The pixel unit of claim 1, wherein the primary driving unit and the sub-driving units both at least comprise a switch device and a driving device, the driving device is electrically connected to the switch device, the switch devices of the primary driving unit and the sub-driving unit are respectively electrically connected to a corresponding one of the signal lines, and the current-driving device is electrically connected to the driving device of one of the primary driving unit and the sub-driving unit.

7. The pixel unit of claim 1, wherein a brightness of the current-driving device of the one of the sub-pixels of the same color in the second state is greater than but not more than twice a brightness of the current-driving device of the one of the sub-pixels of the same color in the first state and a brightness of the current-driving device of the other one of the sub-pixels of the same color in the first state.

8. The pixel unit of claim 1, wherein a brightness of the current-driving device of one of the sub-pixels of the same color in the first state is substantially equal to a brightness of the current-driving device of the other one of the sub-pixels of the same color in the first state.

9. A pixel unit comprising:
a plurality of signal lines;
at least two power lines; and
two pixel groups respectively corresponding to and electrically connected to the signal lines, wherein each of the pixel groups has three sub-pixels of different colors, two of the sub-pixels of a same color are respectively located in different pixel groups of the pixel groups, each of the sub-pixels of the same color have a primary driving unit, a sub-driving unit, and a current-driving device, and the current-driving devices of the sub-pixels of the same color respectively correspond to and are electrically connected to the power lines, wherein when in a first state, the primary driving unit of one of the sub-pixels of the same color is electrically connected to the current-driving device of the one of the sub-pixels of the same color through a first bridge electrode, the primary driving unit of the other one of the sub-pixels of the same color is electrically connected to the current-driving device of the other one of the sub-pixels of the same color through a second bridge electrode, without enabling the sub-driving units of the sub-pixels of the same color, where an open circuit is formed between the sub-driving unit of one of the sub-pixels of the same color and one of the power lines and is formed between the sub-driving unit of the other one of the sub-pixels of the same color and the primary driving unit of the one of the sub-pixels as well as the first bridge electrode, respectively, when in a second state, the primary driving unit of the one of the sub-pixels of the same color is electrically connected to the current-driving device of the one of the sub-pixels of the same color through the first bridge electrode, the sub-driving unit of the other one of the sub-pixels of the same color is electrically connected to the current-driving device of the one of the sub-pixels of the same color through a third bridge electrode, without enabling the sub-driving unit of the one of the sub-pixels of the same color and the primary driving unit of the other one of the sub-pixels of the same color, wherein an open circuit is formed between the sub-driving unit of one of the sub-pixels of the same color and one of the power lines and is formed between the primary driving unit as well as the current-driving device of the other one of the sub-pixels of the same color and the primary driving unit of the one of the sub-pixels, respectively.

10. The pixel unit of claim 9, wherein the current-driving device comprises a micro light emitting device.

11. The pixel unit of claim 9, wherein the primary driving units and the sub-driving units of the sub-pixels of the same color are electrically connected to a same signal line of the signal lines.

12. The pixel unit of claim 11, wherein the same signal line is a data line.

13. The pixel unit of claim 11, wherein the same signal line is a scan line.

14. The pixel unit of claim 9, wherein the primary driving units and the sub-driving units of the sub-pixels are staggered arrangement.

15. The pixel unit of claim 9, wherein the primary driving unit and the sub-driving units both comprise a switch device and a driving device, the driving device is electrically connected to the switch device, the switch devices of the primary driving unit and the sub-driving unit are respectively electrically connected to a corresponding one of the signal lines, and the current-driving device is electrically connected to the driving device of the one of the primary driving unit and the sub-driving unit.

16. The pixel unit of claim 9, further comprising a connection electrode located between the primary driving unit of the one of the sub-pixels of the same color and the sub-driving unit of the other one of the sub-pixels of the same color, and the third bridge electrode is electrically connected to the first bridge electrode through the connection electrode.

17. The pixel unit of claim 9, wherein a brightness of the current-driving device of one of the sub-pixels of the same color in the second state is greater than a brightness of the current-driving device of the one of the sub-pixels of the same color in the first state and a brightness of the current-driving device of the other one of the sub-pixels of the same color in the first state and in the second state.

18. The pixel unit of claim 9, wherein a brightness of the current-driving device of the one of the sub-pixels of the same color in the second state is greater than but not more than twice a brightness of the current-driving device of the one of the sub-pixels of the same color in the first state and a brightness of the current-driving device of the other one of the sub-pixels of the same color in the first state.

19. The pixel unit of claim 9, wherein a brightness of the current-driving device of the one of the sub-pixels of the same color in the first state is substantially equal to a brightness of the current-driving device of the other one of the sub-pixels of the same color in the first state.

\* \* \* \* \*